(12) United States Patent
Zhang et al.

(10) Patent No.: US 11,600,584 B2
(45) Date of Patent: Mar. 7, 2023

(54) CHIP, CIRCUIT BOARD AND ELECTRONIC DEVICE

(71) Applicant: Beijing Xiaomi Mobile Software Co., Ltd., Beijing (CN)

(72) Inventors: Jinfu Zhang, Beijing (CN); Yunjun Hua, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/208,383

(22) Filed: Mar. 22, 2021

(65) Prior Publication Data

US 2021/0305184 A1    Sep. 30, 2021

(30) Foreign Application Priority Data

Mar. 26, 2020   (CN) .......................... 202020412004.1
Jul. 8, 2020    (CN) .......................... 202010653932.1

(51) Int. Cl.
*H01L 23/498*   (2006.01)
*H01L 23/00*    (2006.01)

(52) U.S. Cl.
CPC ........ *H01L 24/06* (2013.01); *H01L 23/49816* (2013.01); *H01L 24/05* (2013.01); *H01L 24/16* (2013.01); *H01L 24/73* (2013.01); *H01L 2224/05012* (2013.01); *H01L 2224/0603* (2013.01); *H01L 2224/06051* (2013.01); *H01L 2224/06131* (2013.01); *H01L 2224/06179* (2013.01); *H01L 2224/165* (2013.01); *H01L 2224/73204* (2013.01); *H01L 2924/0105* (2013.01); *H01L 2924/3512* (2013.01)

(58) Field of Classification Search
CPC ...................................................... H01L 24/06
See application file for complete search history.

(56) References Cited

U.S. PATENT DOCUMENTS

| 6,429,390 | B1 | 8/2002 | Cummings et al. |
| 2001/0001508 | A1 | 5/2001 | Garrity et al. |
| 2003/0054589 | A1 | 3/2003 | Matsuda et al. |
| 2009/0114436 | A1 | 5/2009 | Chen et al. |
| 2010/0180249 | A1 | 7/2010 | Rumsey et al. |
| 2010/0295186 | A1 | 11/2010 | Kawabata et al. |

(Continued)

FOREIGN PATENT DOCUMENTS

| EP | 3 890 004 A1 | 10/2021 |
| JP | H 10335796 A | 12/1998 |

(Continued)

OTHER PUBLICATIONS

Extended European Search Report in European Application No. 21164238.4, dated Sep. 6, 2021.

(Continued)

*Primary Examiner* — William A Harriston
(74) *Attorney, Agent, or Firm* — Finnegan, Henderson, Farabow, Garrett & Dunner, L.L.P.

(57) ABSTRACT

A chip includes: a chip substrate including a central area and an edge area surrounding the central area; and a plurality of pads arranged on the chip substrate, the plurality of pads including a first pad and a second pad, wherein the first pad is arranged in the edge area and includes at least one straight side adjacent to a side of the chip substrate, and the second pad is arranged in the central area.

18 Claims, 14 Drawing Sheets

(56) References Cited

U.S. PATENT DOCUMENTS

| | | |
|---|---|---|
| 2011/0108981 A1 | 5/2011 | Rahim et al. |
| 2011/0309515 A1 | 12/2011 | Yokoyama |
| 2012/0199969 A1 | 8/2012 | Yokoyama |
| 2013/0049206 A1 | 2/2013 | Ryan |
| 2013/0062741 A1 | 3/2013 | Wu et al. |
| 2017/0062322 A1* | 3/2017 | Sakata .............. H01L 23/49838 |
| 2019/0280038 A1 | 9/2019 | Keel et al. |

FOREIGN PATENT DOCUMENTS

| | | | |
|---|---|---|---|
| JP | 2000031631 A | 1/2000 | |
| JP | 2000269271 A | 9/2000 | |
| JP | 2001127202 A | 5/2001 | |
| JP | 2005026312 A | 1/2005 | |
| JP | 3758289 B2 | 3/2006 | |
| JP | 19970093764 * | 3/2006 | ............. H01L 21/60 |
| JP | 2006210851 A | 8/2006 | |
| JP | 2009054969 A | 3/2009 | |
| JP | 2009218233 A | 9/2009 | |
| JP | 20080056932 * | 9/2009 | ........... H01L 21/321 |
| JP | 2010-287758 A | 12/2010 | |
| JP | 2019071345 A | 5/2019 | |
| KR | 10-2017-0047487 A | 5/2017 | |

OTHER PUBLICATIONS

Extended European Search Report in European Application No. 21164242.6, dated Oct. 26, 2021.
Non-Final Office Action for U.S. Appl. No. 17/208,454, dated Apr. 22, 2022.
Notice of Reasons for Refusal of Japanese Application No. 2021-044590, dated Apr. 8, 2022.
Notice of Reasons for Refusal of Japanese Application No. 2021-044597, dated Mar. 18, 2022.
Decision to Grant a Patent for Japanese Patent Application No. 2021-044590, dated Oct. 27, 2022, 5 pages.
Request for the Submission of an Opinion dated Jan. 9, 2023, from the Korean Intellectual Property Office in counterpart Korean application No. 10-2021-0035300.

* cited by examiner

CHIP, CIRCUIT BOARD AND ELECTRONIC DEVICE

CROSS REFERENCE TO RELATED APPLICATIONS

The present application is based upon and claims the priority of Chinese Patent Application No. 202010653932.1, filed on Jul. 8, 2020, and Chinese Patent Application No. 202020412004.1, filed on Mar. 26, 2020, the entire content of both of which is incorporated herein by reference.

TECHNICAL FIELD

The present disclosure relates to the field of electronic technology, in particular to chips, circuit boards and electronic devices.

BACKGROUND

In related technologies, an electronic device, such as a mobile phone, usually contains a chip for realizing various functions, and electronic components and control circuits on the chip are packaged through pads and tin balls soldered on the pads.

However, with increasing requirements for chip functions and lightness and thinness of an electronic device, complexity of chip circuits per unit size for packaging is increasing, and the size of a pad and spacing between pads of the chip are gradually reduced to fit to a packaging circuit, and thus structural strength of the pad and soldering strength between the pad and the tin ball are reduced, which may cause problems of solder joint fracture and electronic device damage during testing and using.

SUMMARY

According to a first aspect of the present disclosure, a chip includes: a chip substrate including a central area and an edge area surrounding the central area; and a plurality of pads arranged on the chip substrate, the plurality of pads including a first pad and a second pad, wherein the first pad is arranged in the edge area and includes at least one straight side adjacent to a side of the chip substrate, and the second pad is arranged in the central area.

According to a second aspect of the present disclosure, a circuit board includes: a circuit board substrate including a central area and an edge area surrounding the central area; and a plurality of pads arranged on the circuit board substrate, the plurality of pads including a first pad and a second pad, wherein the first pad is arranged in the edge area and includes at least one straight side adjacent to a side of the circuit board substrate, and the second pad is arranged in the central area.

According to a third aspect of the present disclosure, an electronic device includes: a chip; and a circuit board. The chip includes: a chip substrate including a central area and an edge area surrounding the central area; and a first plurality of pads arranged on the chip substrate, the first plurality of pads including a first pad and a second pad, wherein the first pad is arranged in the edge area and includes at least one straight side adjacent to a side of the chip substrate, and the second pad is arranged in the central area. The circuit board includes: a circuit board substrate including a central area and an edge area surrounding the central area; and a second plurality of pads arranged on the circuit board substrate, the second plurality of pads including a third pad and a fourth pad, wherein the third pad is arranged in the edge area and includes at least one straight side adjacent to a side of the circuit board substrate, and the fourth pad is arranged in the central area.

It should be understood that the above general description and the following detailed description are only exemplary and explanatory, and do not limit the present disclosure.

BRIEF DESCRIPTION OF THE DRAWINGS

The drawings, which illustrate embodiments consistent with the present disclosure, are incorporated into the specification and constitute a part of the specification. The drawings together with the specification are used to explain the principle of the present disclosure.

DETAILED DESCRIPTION

Exemplary embodiments will be described in detail below, and examples thereof are shown in the accompanying drawings. In the following description, same numbers in different drawings represent same or similar elements, unless otherwise indicated. The embodiments described in the following exemplary embodiments do not represent all of embodiments consistent with the present disclosure. Rather, they are only examples of devices consistent with some aspects of the present disclosure as recited in the appended claims.

Figure 1:
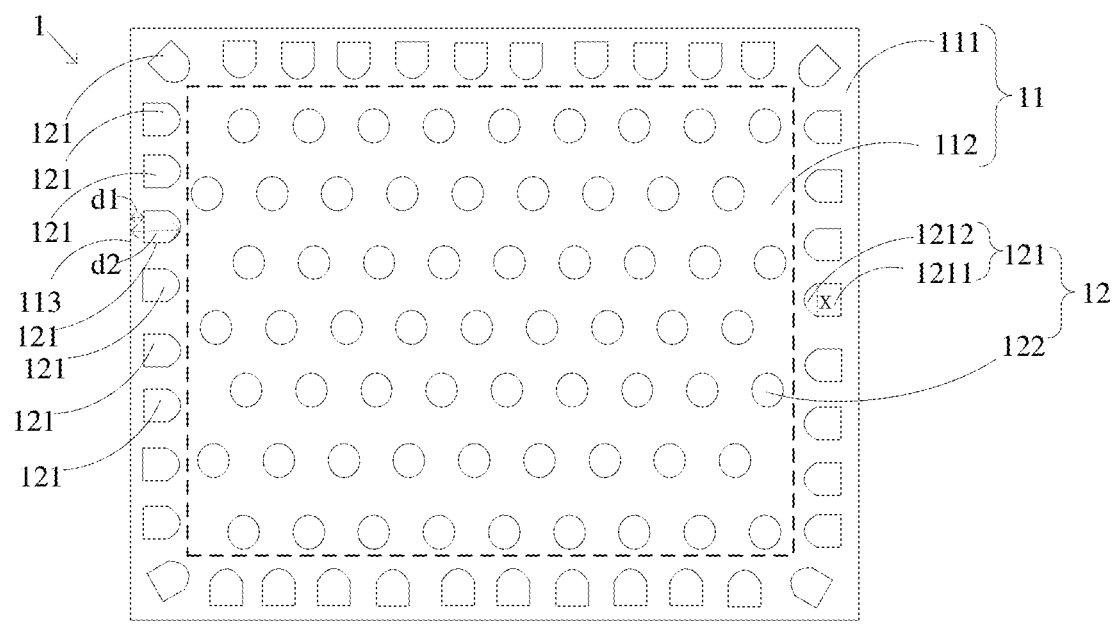
FIG. 1 is a schematic top view of a chip before soldering tin balls in an exemplary embodiment of the present disclosure.
Figure 2:
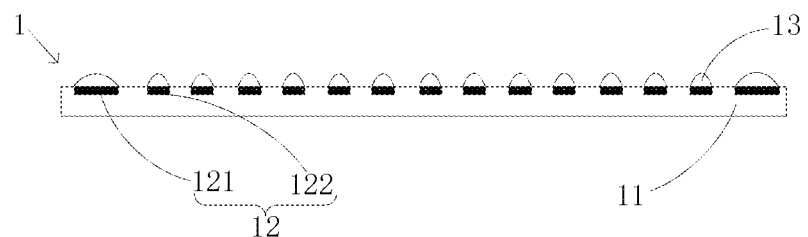
FIG. 2 is a schematic cross-sectional diagram of a chip after soldering tin balls in an exemplary embodiment of the present disclosure.

FIG. 1 is a schematic top view of a chip 1 before soldering tin balls in an exemplary embodiment of the present disclosure; and FIG. 2 is a schematic cross-sectional diagram of the chip 1 after soldering tin balls in an exemplary embodiment of the present disclosure. As shown in FIG. 1 and FIG. 2, the chip 1 includes a substrate 11 and a plurality of pads 12 arranged on the substrate 11, and a tin ball 13 is soldered on each pad 12. The plurality of pads 12 include a first pad 121 and a second pad 122. The substrate 11 includes a central area 112 and an edge area 111 surrounding the central area 112. The first pad 121 is provided in the edge area 111 and the second pad 122 is provided in the central area 112. The first pad 121 includes a polygonal soldering area 1211 and an arcuate soldering area 1212 connected to the polygonal soldering area 1211, and the polygonal soldering area 1211 is disposed between the arcuate soldering area 1212 and a side of the substrate 11.

In the above embodiments, an intersection line x at the boundary between the polygonal soldering area 1211 and the arcuate soldering area 1212 is represented by a dotted line in FIG. 1, and a polygonal area formed by points on the intersection line x or by the intersection line x and the straight sides is a polygonal soldering area 1211. The polygonal soldering area 1211 is disposed between the arcuate soldering area 1212 and the side of the substrate 11, which may refer to that a first pad 121 is located close to any side of the substrate 11, and a distance from any point on the polygonal soldering area 1211 of the first pad 121 to the side of the substrate 11 is smaller than a distance from any point on the arcuate soldering area 1212 of the same first pad 121 to the side of the substrate 11. For example, as shown in FIG. 1, a plurality of first pads 121 are provided close to a side 113 of the substrate 11, and the distance $d_1$ from any point on the polygonal soldering area 121 of the first pad 121 to the side 113 is smaller than the distance $d_2$ from any point on the arcuate soldering area 1212 of the same first pad 121 to the side 113.

The plurality of pads 12 on the chip 1 are divided into first pads 121 arranged in the edge area 111 of the substrate 11 and second pads 122 arranged in the central area 112 of the substrate 11, and the polygonal soldering area 1211 of the first pad 121 is arranged between the arcuate soldering area 1212 and a side of the substrate 11, so that each straight side of the polygonal soldering area 1211 can share the stress from peripheral edge of the substrate 11, and the arc side of the arcuate soldering area 1212 can decompose stress from internal of the substrate 11. Based on the above structure, stress resistance (i.e., the ability to resist stress) of each pad 12 located in a different area of the substrate 11 can be strengthened, structural strength of the pad 12 and bonding strength of the pad 12 and the tin ball 13 can be increased, such that the pad 12 and the tin ball 13 can be prevent from being disconnected from each other due to stress concentration in the edge area 111 caused by impacts, drops and the like during testing and using, and thus, the chip 1 can obtain better test results with increasing number of impact tests, thereby improving life of the chip 1, and the circuit board assembly and the electronic device including the chip 1.

According to the Griffith fracture criterion: a necessary condition for generating a brittle fracture under a static condition is that energy released by a fracture zone is equal to energy required to form the crack area. That is, if the energy generated by external stress is to produce a crack, the energy due to the external stress must be greater than the energy required to form the crack area. When the crack area is approximated as a rectangle for calculation, it is found that when the crack depth is the same, the longer the crack, the larger the crack area; the wider the width of the crack surface, the shorter the crack length, and the smaller the crack area when the crack depth is the same. That is, the increase in the width of the surface where cracks may occur can effectively decompose the stress acting on the surface. Straight sides of the polygonal soldering area 1211 of the first pad 121 of the present disclosure prolong the width of the crack surface that may occur, and thus can share the stress from peripheral edge of the substrate 11, thereby increasing the structural strength of the pad 12 itself and the bonding strength between the pad 12 and the tin ball 13.

A side of the first pad 121 facing the central area 112 may bear stress from various directions which is generated from other pads 12 and internal of the substrate 11 to the first pad 121. The arc side of the arcuate soldering area 1212 can decompose the stress from the internal of the substrate 11, buffer the stress from various directions, thus having a better stress buffering effect.

The pad 12 may be a copper sheet provided on the substrate 11, and the pad 12 can be electrically connected to a control circuit or an electronic component of the chip 1. The polygonal soldering area 1211 of the first pad 121 may be a polygonal soldering area 1211 having a plurality of straight sides, such as a quadrilateral, pentagonal, or hexagonal soldering area 1211. The arcuate soldering area 1212 of the first soldering area 121 may be an arc formed by an arc-shaped line and any side of the polygonal soldering area 1211. The first pad 121 may be formed by combining a polygonal soldering area 1211 and an arcuate soldering area 1212, or the first pad 121 may also include a plurality of polygonal soldering areas 1211 and a plurality of arcuate soldering areas 1212, which is not limited thereto.

In an embodiment, the second pad 122 may be a soldering area formed by surrounding arc lines, such as a circular soldering area, an elliptical soldering area, or the like. In an embodiment, the second pad 122 may be an irregularly shaped soldering area surrounded by one or more arc lines. In this way, internal stress of the chip 1 can be buffered by one or more arc structures at the edge of the second pad 122.

It should be noted that an angle between adjacent sides of the substrates 11 may be a right angle or other angles, and the substrate 11 may be rectangular, polygonal, irregular graphics, etc., which is not limited thereto.

In the following exemplary embodiments, a rectangular substrate 11, a circular second pad 122, and the first pad 121 including a rectangular soldering area and an arcuate soldering area 1212 that fits the rectangular soldering area are shown as an example to illustrate the arrangement of the first pad 121 and the second pad 122.

Figure 3:
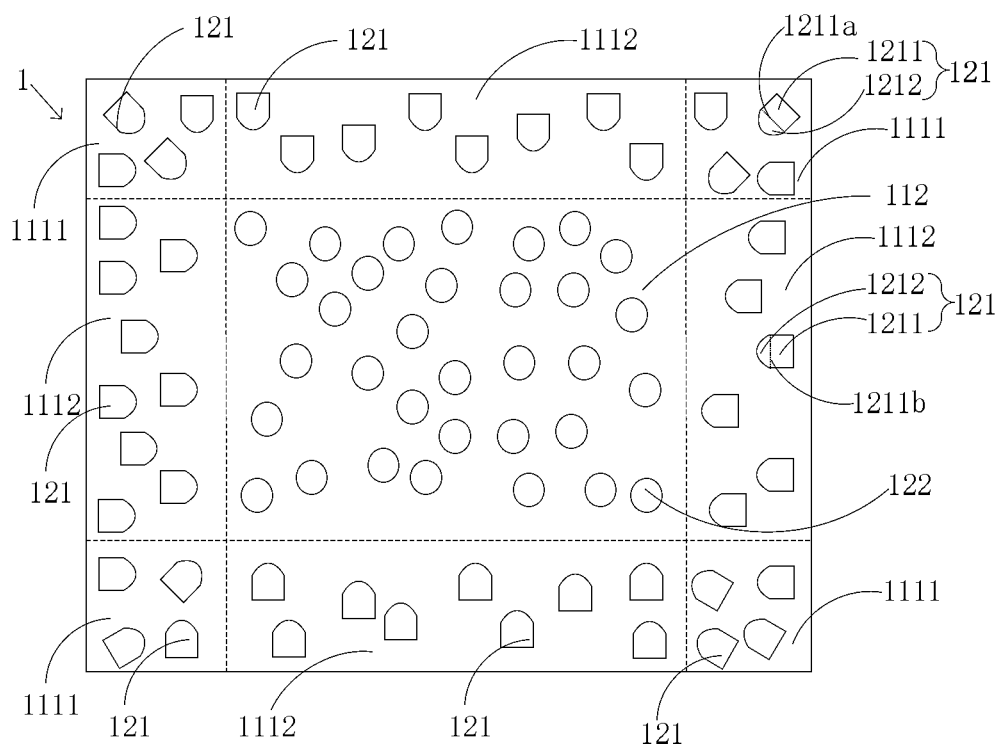
FIG. 3 is a schematic top view of a chip before soldering tin balls in an exemplary embodiment of the present disclosure.

In some embodiments, shown in FIG. 3, the edge area 111 of the substrate 11 may include a straight edge sub-area 1112 and a corner edge sub-area 1111 connecting two adjacent straight edge sub-areas 1112. The first pads 121 can be provided in the straight edge sub-area 1112 and the corner edge sub-area 1111, respectively. By dividing the edge area 111 of the substrate 11 into a straight edge sub-area 1112 and a corner edge sub-area 1111, the differentiation of stress levels at different positions on the edge of the substrate 11 can be realized. By providing the first pads 121 in the straight edge sub-area 1112 and the corner edge sub-area 1111, respectively, the first pads 121 provided in the straight edge sub-area 1112 and the corner edge sub-area 1111 can obtain a stress buffering effect based on the position of the first pad.

In an embodiment, as shown in FIG. 3, the first pads 121 arranged in the straight edge sub-area 1112 and the corner edge sub-area 1111 are irregularly distributed, but the rectangular soldering area of the first pad 121 is still arranged between the side of the substrate 11 and the arcuate soldering area 1212. The arrangement of the first pad 121 in the straight edge sub-area 1112 and the corner edge sub-area 1111 is not specified, and thus the space utilization rate of the first pad 121 on the substrate 11 can be increased, and the first pad 121 can be provided more flexibly. As for the rectangular soldering area provided between the side of the substrate 11 and the arcuate soldering area 1212, the stress from the peripheral edge of the substrate 11 can be shared by the straight side of the rectangular soldering area that faces the side of the substrate 11, and the arc side of the arcuate soldering area 1212 that faces the central area 112 of the substrate 11 can decompose the stress from the internal of the substrate 11, thereby enhancing the stress resistance of each pad 12 located in different areas of the substrate 11.

For example, the circular soldering areas of the second pads 122 can be irregularly distributed in the central area 112 of the substrate 11, and the first pads 121 are irregularly distributed in the straight edge sub-area 1112 and the corner edge sub-area 1111. The side of the rectangular soldering area of the first pads 121 provided in the straight edge sub-area 1112 may be parallel or perpendicular to the side of the substrate 11, and the arc side of the arcuate soldering area 1212 may be matched with a side 1211b (which is parallel to the side of the substrate 11) of the rectangular soldering area. Two opposite sides of the rectangular soldering area of the first pad 121 arranged in the corner edge sub-area 1111 may be at 45° with respect to the two corresponding sides of the substrate 11 respectively, and the arc side of the arcuate soldering area 1212 may be matched with a side 1211a (which is facing the central area 112) of the rectangular soldering area. Alternatively, the two opposite sides of the rectangular soldering area of the first pad 121 arranged in the corner edge sub-area 1111 may be at another angle with respect to the two corresponding sides of the substrate 11 respectively, the angle may be provided according to the direction in which the substrate 11 may generate stress, and it is not limited thereto. Based on the above arrangement, the buffering effect of the first pad 121 on stress in various directions can be improved, and the stress resistance of each pad 12 located in different areas of the substrate 11 can be enhanced.

Figure 4:
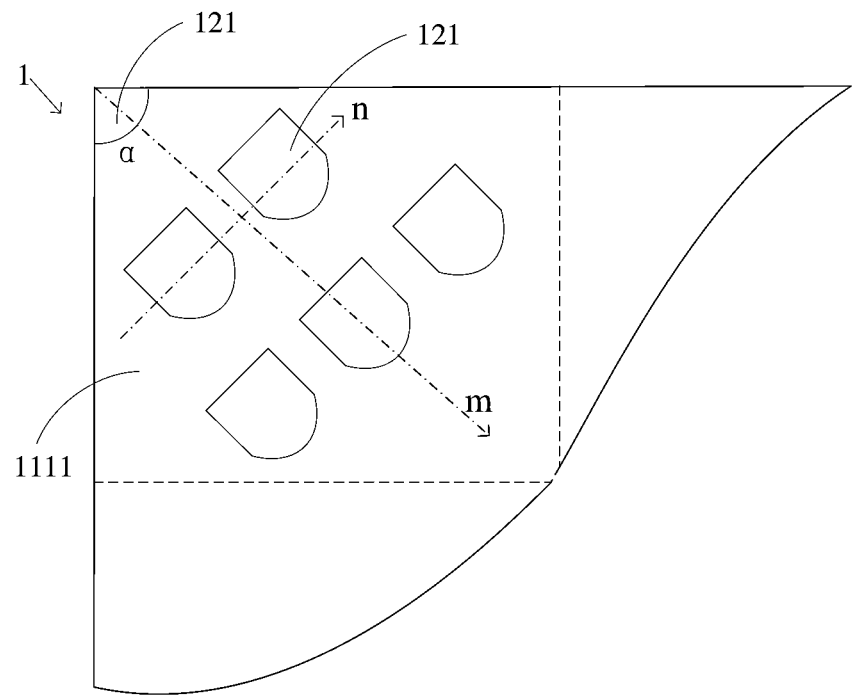
FIG. 4 is a partial enlarged diagram of a corner edge sub-area in an exemplary embodiment of the present disclosure.

In an embodiment, as shown in FIG. 4, the dotted arrow n represents the first lateral direction, and the dotted arrow m represents the first vertical direction. A plurality of first pads 121 are arrayed in the corner edge sub-area 1111, and the array direction of the first pads 121 arranged in the corner edge sub-area 1111 includes the first lateral direction n and the first vertical direction m. The side of the rectangular soldering area of the first pad 121 may be parallel or perpendicular to the first vertical direction m. By arraying the first pad 121 in the corner edge sub-area 1111 to increase the stress buffering ability of the first pad 121, each of the first pads 121 arrayed in the corner edge sub-area 1111 can deal with the stress from the corner edge sub-area 1111 of the substrate 11, and each first pad 121 can buffer the edge stress with maximum efficiency. The direction of the stress from the corner edge sub-area 1111 of the substrate 11 may be the same as the first vertical direction m, or may be at a preset angle with the first vertical direction m.

Further, the number of rows of the first pads 121 in the first vertical direction m may be greater than or equal to two, so as to achieve a buffering effect on the edge stress by expanding the array area of the first pads 121, and prevent the edge stress range from being too large to exceed coverage area of the first pad 121.

Further, the corner edge sub-area 1111 includes two adjacent sides of the substrate 11 and an angle between the two sides of the substrate 11. The first vertical direction m is parallel to a bisector line of the angle, and the first lateral direction n may be perpendicular to the first vertical direction m. By defining the direction of the first vertical direction m as the direction of the bisector line of the angle, the side of the rectangular soldering area of the first pad 121 disposed in the corner edge sub-area 1111 can be parallel or perpendicular to the first vertical direction m, so that the first pad 121 can buffer the edge stress with maximum efficiency.

In some embodiments, the first vertical direction m may also be at another angle with respect to the bisector line of the aforementioned angle, so as to achieve the best buffering effect of the first pad 121 on the edge stress, which is not limited in the present disclosure.

Figure 5:
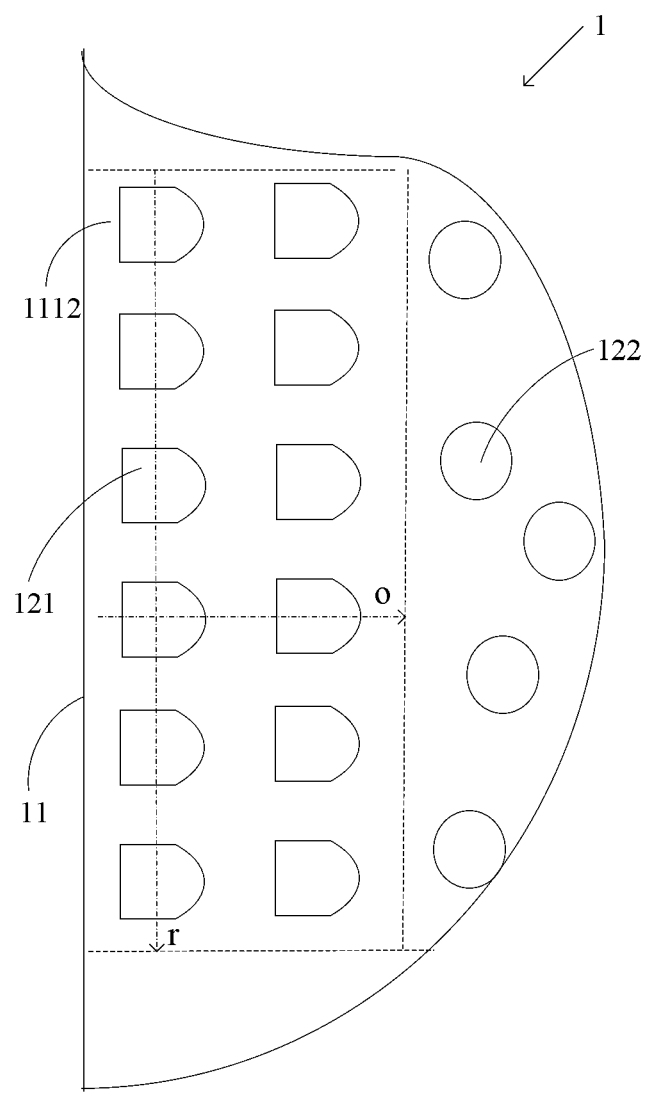
FIG. 5 is a partial enlarged diagram of a straight edge sub-area in an exemplary embodiment of the present disclosure.

In an embodiment, as shown in FIG. 5, the dotted arrow r represents a second lateral direction, and the dotted arrow o represents a second vertical direction. An array of the plurality of first pads 121 is arranged in the straight edge sub-area 1112, and the array direction of the first pads 121 arranged in the straight edge sub-area 1112 includes a second lateral direction r and a second vertical direction o. The side of the rectangular soldering area of the first pads 121 may be parallel or perpendicular to the second vertical direction o. By arraying the first pads 121 in the straight edge sub-area 1112 to increase the stress buffering ability of the first pads 121, each of the first pads 121 arrayed in the straight edge sub-area 1112 can deal with the stress from the edge of the substrate 11, and each first pad 121 can buffer the edge stress with maximum efficiency. The direction of the stress from the straight edge sub-area 1112 of the substrate 11 may be the same as the second vertical direction o, or may be at a preset angle with the second vertical direction o.

Further, the second vertical direction o may be perpendicular to the side of the substrate 11 of the straight edge sub-area 1112, and the second lateral direction r may be perpendicular to the second vertical direction o. The number of rows of the first pad 121 in the second vertical direction o may be greater than or equal to one, so as to achieve a buffering effect on edge stress based on the array area of the first pads 121.

Figure 6:
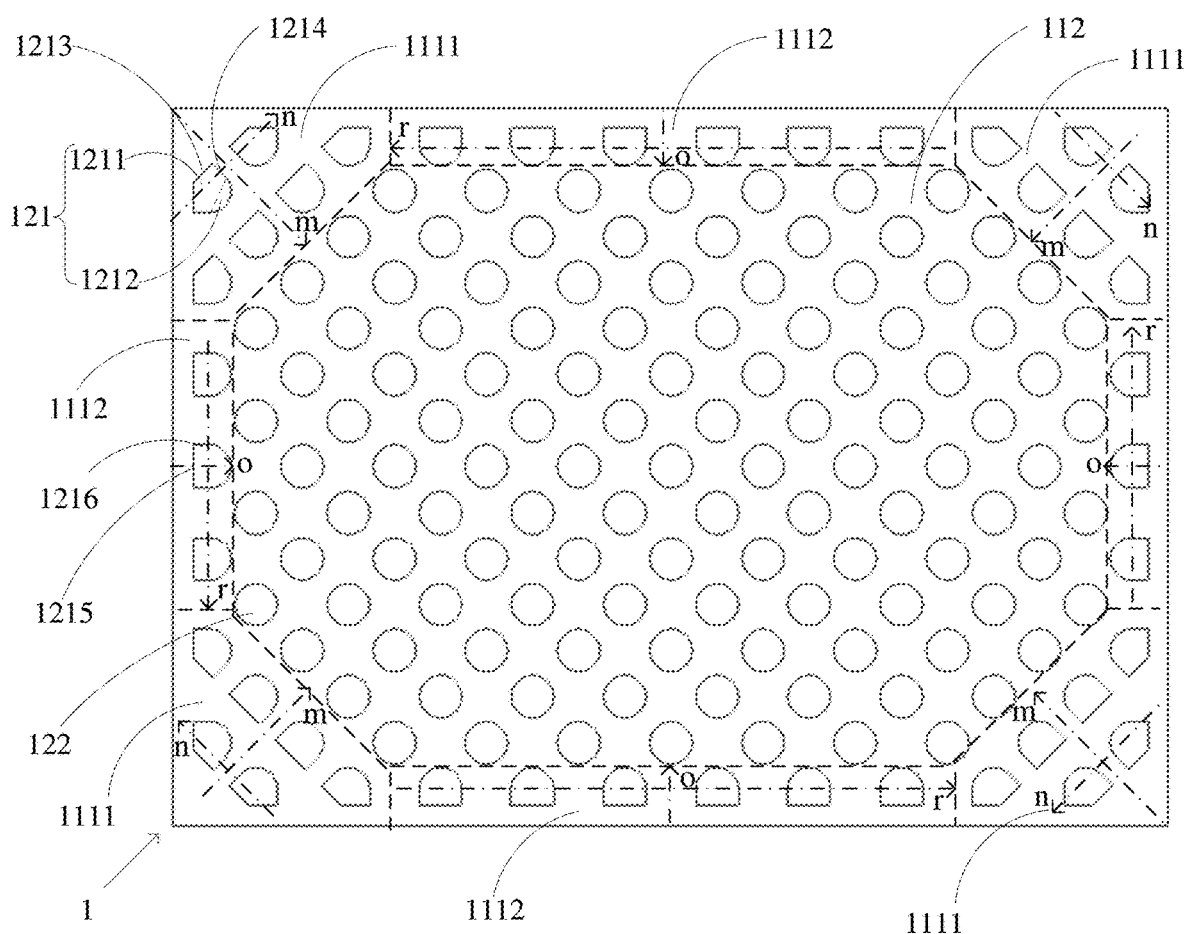
FIG. 6 is a schematic top view of a chip before soldering tin balls in an exemplary embodiment of the present disclosure.

In an embodiment, as shown in FIG. 6, a plurality of first pads 121 are arrayed in the corner edge sub-area 1111, and the array direction of the first pads 121 arranged in the corner edge sub-area 1111 includes the first lateral direction n and the first vertical m. A plurality of first pads 121 are arrayed in the straight edge sub-area 1112, and the array direction of the first pads 121 arranged in the straight edge sub-area 1112 includes the second lateral direction r and the second vertical direction o. The corner edge sub-area 1111 includes two adjacent sides of the substrate 11 and an angle between the two sides of the substrate 11. The first vertical direction m is parallel to the bisector line of the angle, and the second vertical direction o may be perpendicular to the side of the straight edge sub-area 1112 of substrate 11, the first lateral direction n may be perpendicular to the first vertical direction m, and the second lateral direction r may be perpendicular to the second vertical direction o. The side of the rectangular soldering area of the first pad 121 provided in the corner edge sub-area 1111 may be parallel or perpendicular to the first vertical direction m, and the side of the rectangular soldering area of the first pad 121 provided in the straight-line edge sub-area 1112 may be parallel or perpendicular to the second vertical direction o, so that the first pad 121 can buffer the edge stress with maximum efficiency. Direction of the stress from the corner edge sub-area 1111 of the substrate 11 may be the same as the first vertical direction m, or is at a preset angle with respect to the first vertical direction m, and direction of the stress from the straight edge sub-area 1112 of the substrate 11 may be the same as the second vertical direction o, or is at a preset angle with respect to the second vertical direction o.

It should be noted that the first lateral direction n and the first vertical direction m may be perpendicular to each other, or may have a preset angle therebetween according to parameters such as the shape of the substrate 11 or the stress direction, which is not limited in the present disclosure. Similarly, the second lateral direction r and the second vertical direction o may be perpendicular to each other, or may have a preset angle therebetween according to parameters such as the shape of the substrate 11 or the stress direction, which is not limited in the present disclosure.

In some embodiments, a plurality of first pads 121 are arrayed in the corner edge sub-area 1111, and the array direction of the first pads 121 arranged in the corner edge sub-area 1111 includes a first lateral direction n and a first vertical direction m. The first pad 121 disposed in the corner edge sub-area 1111 includes a first straight side 1213 and a second straight side 1214. The first straight side 1213 is parallel to the first lateral direction n, and the second straight side 1214 is parallel to the first vertical direction m. That is, in the corner edge sub-area 1111, according to the first lateral n and the first vertical m of the array of the first pads 121, the first straight side 1213 is provided to be parallel to the first lateral n, and the second straight side 1214 is provided to be parallel to the first vertical direction m, such that each first pad 121 can have a straight side in the array direction for buffering stress, thereby improving the stress buffering effect and structural strength of the first pads 121 being arrayed.

Further, the first pads 121 being arrayed form a lateral row in the first lateral direction n, and the first straight sides 1213 of the first pads 121 located in the same lateral row may be on a same straight line, so that the first straight sides 1213 of the first pads 121 in the lateral row have a same stress buffering effect. The first pads 121 being arrayed form a vertical column in the first vertical direction m, and the second straight sides 1214 located in the same vertical column may be on a same straight line, so that the second straight sides 1214 of the first pads 121 in the vertical column have a same stress buffering effect.

In an embodiment, a plurality of the first pads 121 are arrayed in the straight edge sub-area 1112, and the array direction of the first pads 121 arranged in the straight edge sub-area 1112 includes a second lateral r and a second vertical direction o. The first pad 121 disposed in the straight edge sub-area 1112 includes a third straight side 1215 and a fourth straight side 1216, the third straight side 1215 is parallel to the second lateral direction r, and the fourth straight side 1216 is parallel to the second vertical direction o. That is, in the straight edge sub-area 1112, according to the second lateral r and the second vertical o of the array of the first pad 121, the third straight side 1215 is provided to be parallel to the second lateral r, and the fourth straight side 1216 is provided to be parallel to the second vertical directions o such that each first pad 121 can have a straight side in the array direction for buffering stress, thereby improving the stress buffering effect and structural strength of the first pads 121 being arrayed.

Further, the first pads 121 being arrayed form a lateral row in the second lateral direction r, and the third straight sides 1215 of the first pads 121 located in the same lateral row may be on a same straight line, so that the third straight sides 1215 of the first pads 121 in the lateral row have a same stress buffering effect. The first pads 121 being arrayed form a vertical column in the second vertical direction o, and the fourth straight sides 1216 located in the same vertical column may be on a same straight line, so that the fourth straight sides 1216 of the first pads 121 in the vertical column have a same stress buffering effect.

In addition, the second pad 122 may be a soldering area formed by arc lines, such as a circular soldering area, an elliptical soldering area, or the like. Alternatively, the second pad 122 may be an irregularly shaped soldering area surrounded by one or more arc lines. In this way, internal stress of the chip 1 can be buffered by one or more arc structures at the edge of the second pad 122. For example, the second pad 122 has a circular soldering area and the diameter of the circular soldering area is 0.23 mm, a plurality of second pads 122 may be arrayed in the central area 112 of the substrate 11. Alternatively, a plurality of second pads 122 may be irregularly distributed in the central area 112 of the substrate 11 according to the structure of the substrate 11 and arrangement of the electronic components.

In the above embodiment, the area of the first pad 121 and the area of the second pad 122 may be same, and thus same amount of tin ball 13 can be the soldered, and interference and influence on the soldering process when improving the structure and shape of the first pad 121 and/or the second pad 122 can be avoided.

In an embodiment, a distance between two adjacent pads 12 may be 0.35 mm, 0.4 mm, 0.5 mm, 0.8 mm, etc., and the distance between two adjacent pads 12 may refer to a distance between centers of the two adjacent pads 12.

Figure 7:
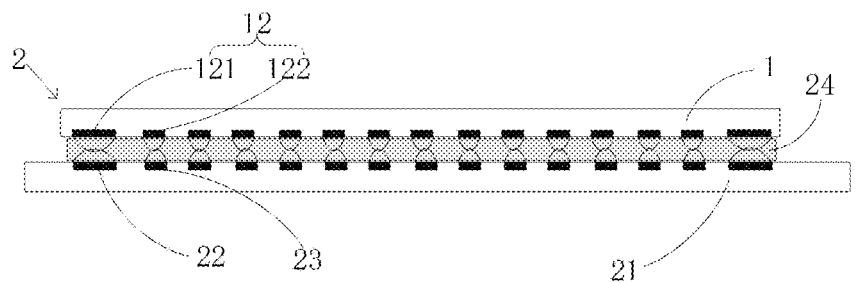
FIG. 7 is a schematic cross-sectional diagram of a circuit board assembly in an exemplary embodiment of the present disclosure.

The present disclosure further provides a circuit board assembly 2. As shown in FIG. 7, the circuit board assembly 2 includes a main board 21 and the above chip 1, and the chip 1 is assembled on the main board 21. The main board 21 is provided with a third pad 22 and a fourth pad 23. The third pad 22 and the first pad 121 are electrically connected in a one-to-one correspondence, and first pad 121 and the third pad 22 corresponding to each other have same structure. The fourth pad 23 and the second pad 122 are electrically connected in a one-to-one correspondence, and the second pad 122 and the fourth pad 23 corresponding to each other have same structure.

A plurality of pads 12 on the chip 1 are divided into a first pad 121 arranged in the edge area 111 of the substrate 11 and a second pad 122 arranged in the central area 112 of the substrate 11, and the polygonal soldering area 1211 of the first pad 121 is arranged between the arcuate soldering area 1212 and a side of the substrate 11, so that each straight side of the polygonal soldering area 1211 can share the stress from peripheral edge of the substrate 11, and the arc side of the arcuate soldering area 1212 can decompose stress from internal of the substrate 11 by cooperating with the circular soldering area of the second pad 122. Based on the above structure, the stress resistance of each pad 12 located in different areas of the substrate 11 can be strengthened, structural strength of the pad 12 and bonding strength of the pad 12 and the tin ball 13 can be increased, such that the pad 12 and the tin ball 13 can be prevent from being disconnected from each other due to the impacts, drops and the like during testing and using, and thus, thereby improving life of the chip 1, and the circuit board assembly 2.

The circuit board assembly 2 further includes a glue filling layer 24 arranged between the main board 21 and the chip 1. The glue filling layer 24 is adhesively bonded to the first pad 121 and the third pad 22 respectively, and the glue filling layer 24 is adhesively bonded to the second pad 122 and the fourth pad 23 respectively.

Figure 8:
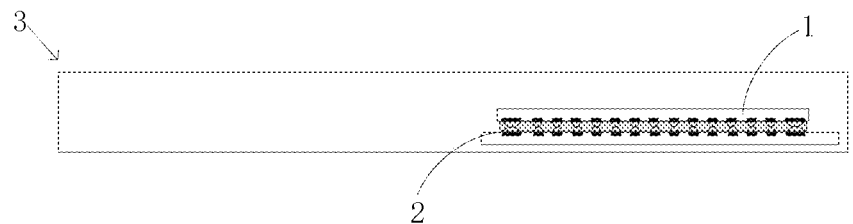
FIG. 8 is a schematic cross-sectional diagram of an electronic device in an exemplary embodiment of the present disclosure.

The present disclosure further provides an electronic device 3 including: the above chip 1 or the above circuit board assembly 2. For example, as shown in FIG. 8, the electronic device 3 includes the above circuit board assembly 2, the circuit board assembly 2 can include a main board 21 and the chip 1, and the chip 1 is assembled on the main board 21.

A plurality of pads 12 on the chip 1 are divided into a first pad 121 arranged in the edge area 111 of the substrate 11 and a second pad 122 arranged in the central area 112 of the substrate 11, and the polygonal soldering area 1211 of the first pad 121 is arranged between the arcuate soldering area 1212 and a side of the substrate 11, so that each straight side of the polygonal soldering area 1211 can share the stress from peripheral edge of the substrate 11, and the arc side of the arcuate soldering area 1212 can decompose stress from internal of the substrate 11 by cooperating with the circular soldering area of the second pad 122. Based on the above structure, the stress resistance of each pad 12 located in different areas of the substrate 11 can be strengthened, structural strength of the pad 12 and bonding strength of the pad 12 and the tin ball 13 can be increased, such that the pad 12 and the tin ball 13 can be prevent from being disconnected from each other due to the impacts, drops and the like during testing and using, and thus, thereby improving life of the chip 1, the circuit board assembly 2, and the electronic device 3. In addition, based on the above-mentioned increasing in the strength of the pad 12 and bonding strength between the pad 12 and the tin ball 13 of the chip 1 and the circuit board assembly 2, it is helpful to reduce the size of the pad 12 and the distance between adjacent pads 12 on the chip 1, thereby reducing size of the chip 1 and improving the lightness and thinness of electronic device 3.

The electronic device 3 may be a mobile phone, a tablet computer, a vehicle-mounted terminal or a medical terminal, etc., which is not limited in the present disclosure.

FIGS. 9-13 are schematic top views of a chip 4 before soldering tin balls in exemplary embodiments of the present disclosure. The chip 4 includes a chip substrate 41 and a plurality of pads 42 provided on the chip substrate 41. As shown in FIGS. 9-12, the plurality of pads 42 includes a first pad 421 and a second pad 422. The chip substrate 41 includes a central area 411 and an edge area 412 surrounding the central area 411. The first pad 421 is provided in the edge area 412, the second pad 422 is provided in the central area 411. The first pad 421 includes at least one straight side adjacent to a side 413 of the chip substrate.

In the above embodiments, the straight side of the first pad 421 can share the stress from the peripheral edge of the chip substrate 41. Based on the above structural arrangement, the stress resistance of each pad 42 located in different areas of the chip substrate 41 can be enhanced, and the structural strength of the pad 42 can be increased. Each pad 42 can be soldered with a tin ball, so the above-mentioned structure arrangement can also facilitate to strengthen the bonding strength of the pad 42 and the tin ball, and prevent the pad 42 and the tin ball from being disconnected from each other due to the impacts, drops and the like during testing and using, and thereby improving life of the chip 4.

In some embodiments, at least one straight side is parallel to the side 413 of the chip substrate to improve the stress resistance of the first pad 421 based on the straight side parallel to the side 413 of the chip substrate. Further, the straight sides of the first pads 412 parallel to the side 413 of the same chip substrate are collinear, and the above collinear straight sides share the stress from the side 413 of the chip substrate, which improves the strength of the pad 42 when the chip 4 is impacted or bumped, and the like, and increase the bonding strength of the pad 42 and the tin ball.

In some embodiments, the areas of the first pad 421 and the second pad 422 are the same. By providing the first pad 421 and the second pad 422 with same area, same amount of tin ball can be soldered on the pad 42, and thus interference and influence on the soldering process when improving the structure and shape of the first pad 421 and/or the second pad 422 can be avoided, thereby improving the soldering stability. For example, the above-mentioned structure can reduce problems of soldering instability caused by missing soldering or uneven amount of tin.

Figure 9:
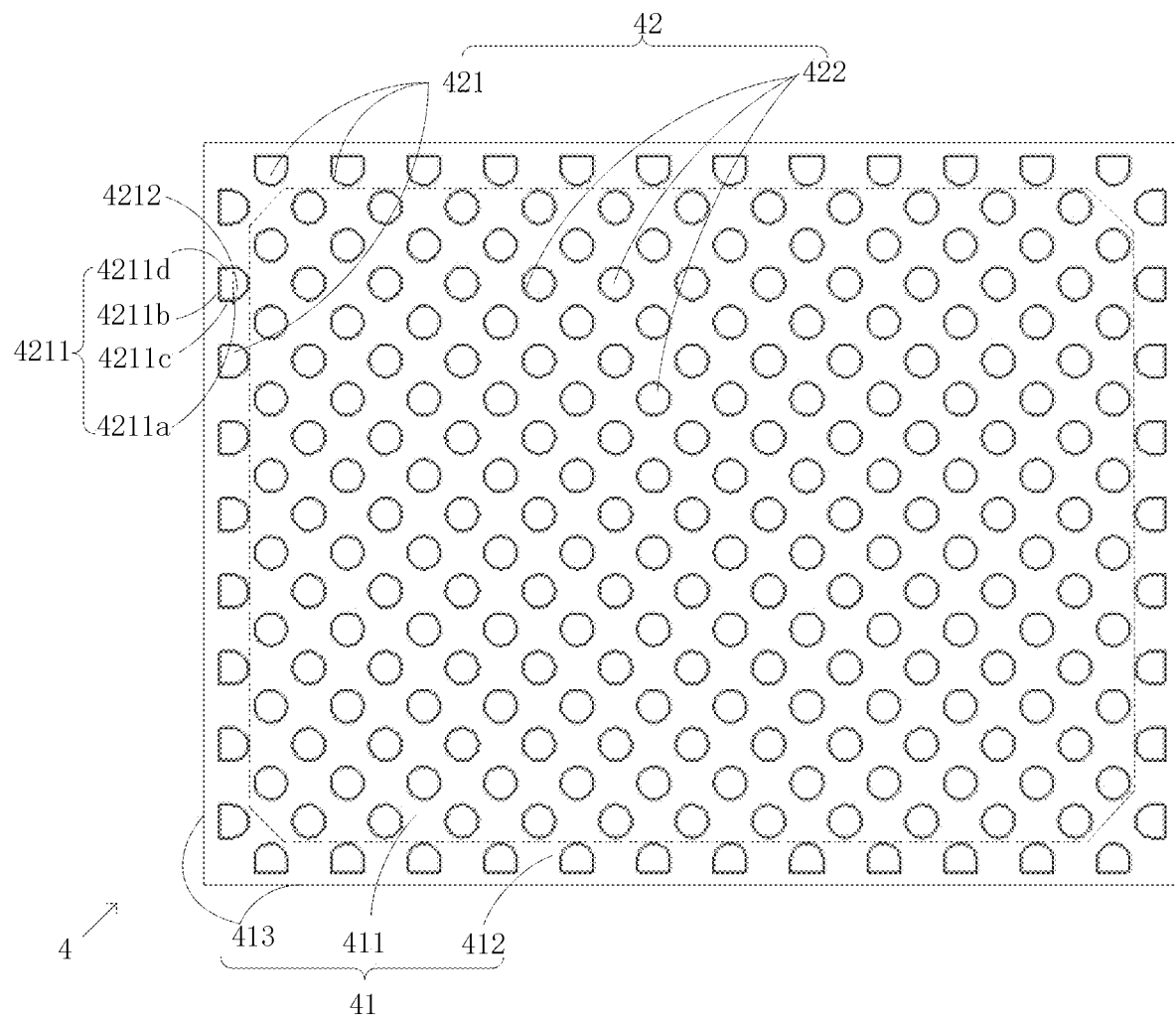
FIG. 9 is a schematic top view of a chip before soldering tin balls in an exemplary embodiment of the present disclosure.

In some embodiments, the first pad 421 includes a rectangular soldering area 4211 and an arcuate soldering area connected to the rectangular soldering area 4211. The arcuate soldering area may be a semicircular soldering area or have other arcuate shapes other than a semicircle, which is not limited thereto. In an embodiment, as shown in FIG. 9, the first pad 421 includes a rectangular soldering area 4211 and a semicircular soldering area 4212 connected to the rectangular soldering area 4211. A side 4211a of the rectangular soldering area 4211 is connected with the diameter side of the semicircular soldering area 4212 to form a soldering area shape of which half is a semicircle and half is a rectangle. The side 4211a of the rectangular soldering area 4211 and a side 4211b which is opposite to the side 4211a are parallel to a side 413 of the chip substrate of the chip 4, and the side 4211b is adjacent to the side 413 of the chip substrate to share stress on the side 413 of the chip substrate; the stress may be perpendicular to the side 413 of chip substrate, or may be at a preset angle with respect to the side 413 of the chip substrate. The rectangular soldering area 4211 may further include a side 4211c and a side 4211d which are perpendicular to the side 4211a, where the side 4211c and the side 4211d are parallel to another side 413 of the chip substrate of the chip 4 to share stress on the another side 413 of the chip substrate; the stress may be perpendicular to the another side 413 of the chip substrate, or may be at a preset angle to the another side 413 of the chip substrate.

The first pad 421 of which half is a semicircle and half is a rectangle may be arranged on a circumference of the edge area 412 of the chip substrate 41. That is, each edge area 412 adjacent to each side 413 of the chip substrate of the chip 4 is provided with one or more rows of the first pad 421 of which half is a semicircle and half is a rectangle to share stress from corresponding side, and the strength of the system can be improved based on this periphery of the chip substrate 41. In addition, the structure of the first pad 421 in this embodiment is provided to be the same to facilitate processing and arrangement.

Figure 10:
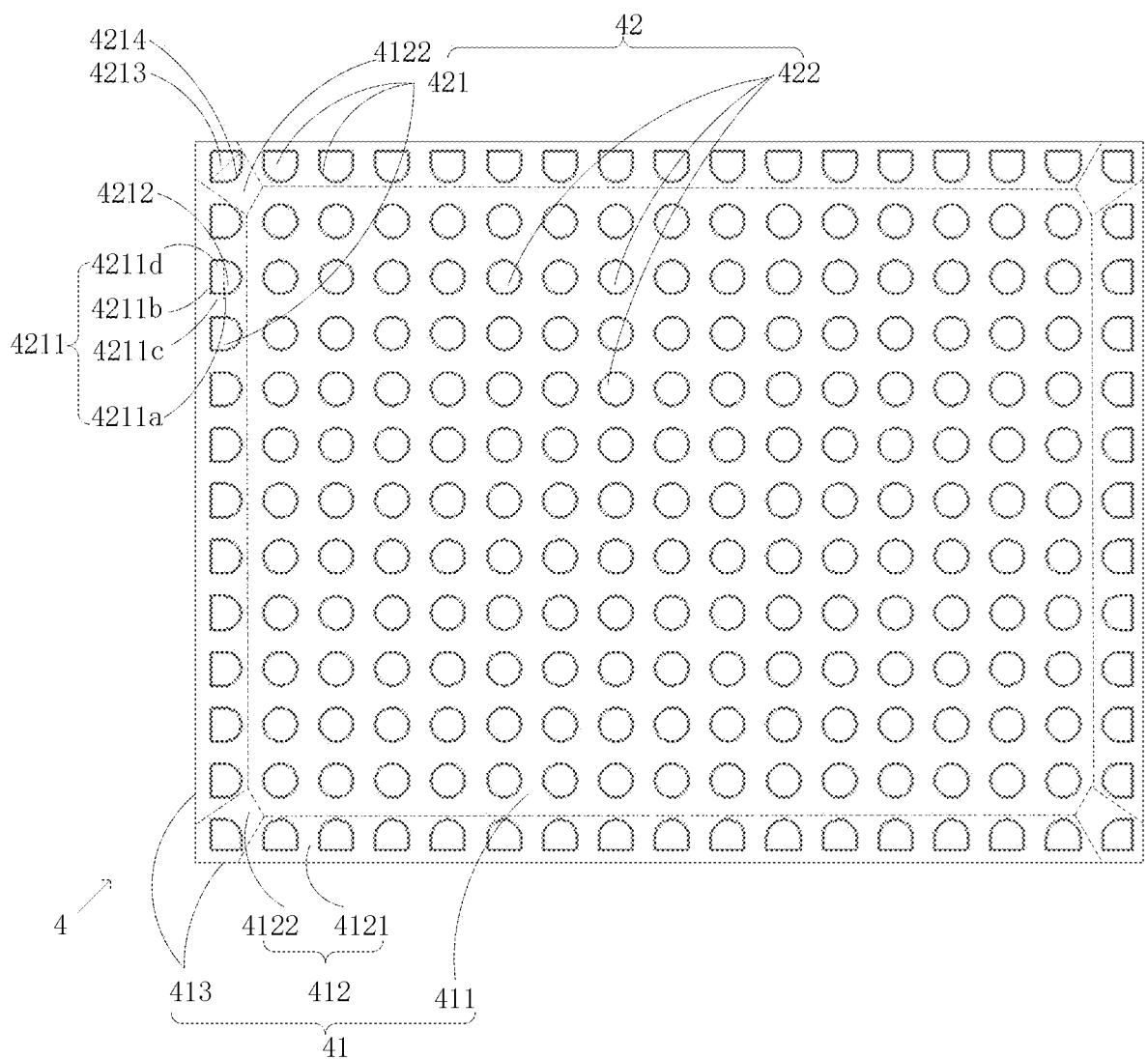
FIG. 10 is a schematic top view of a chip before soldering tin balls in an exemplary embodiment of the present disclosure.

In an embodiment, as shown in FIG. 10, the first pad 421 includes a rectangular soldering area 4211 and a semicircular soldering area 4212 connected to the rectangular soldering area 4211. A side 4211a of the rectangular soldering area 4211 is connected with the diameter side of the semicircular soldering area 4212 to form a soldering area shape of which half is a semicircle and half is a rectangle. The first pad 421 further includes a triangular soldering area 4213 and an arcuate soldering area 4214 connected to the triangular soldering area 4213. A side of the triangular soldering area 4213 is connected with a bowstring of the arcuate soldering area 4214 to form a sector-shaped soldering area. The edge area 412 includes a straight edge sub-area 4121 and a corner edge sub-area 4122 connecting two adjacent straight edge sub-areas 4121.

The first soldering area of which half is a semicircle and half is a rectangle can be arranged in the straight edge sub-area. The rectangular soldering area 4211 of the first soldering area of which half is a semicircle and half is a rectangle has a side 4211a and a side 4211b opposite to the side 4211a which are parallel to a side 413 of the chip substrate of the chip 4, and the side 4211b is adjacent to a side 413 of the chip substrate to share stress acting on the side 413 of the chip substrate, and the stress may be perpendicular to the side 413 of the chip substrate, or may be at a preset angle with respect to the side 413 of the chip substrate. The rectangular soldering area 4211 may further include a side 4211c and a side 4211d perpendicular to the side 4211a, where the side 4211c and the side 4211d are parallel to another side 413 of the chip substrate of the chip 4 to share stress acting on the another side 413 of the chip substrate, and the stress may be perpendicular to the another side 413 of the chip substrate, or may be at a preset angle to the side 413 of the chip substrate.

The sector-shaped first soldering area is arranged in the corner edge sub-area 4122. The triangular soldering area 4213 may be a right triangle soldering area 4213. Two legs of the right triangle soldering area 4213 are respectively parallel to two adjacent sides 413 of the chip substrate to share the stress acting on the corner edge sub-area 4122, where the stress may be perpendicular to any one of the two adjacent sides 413 of the chip substrate, or may have a preset angle with any one of the two adjacent sides 413 of the chip substrate.

In some embodiments, the edge area 412 includes the straight edge sub-area 4121 and the corner edge sub-area 4122 connecting two adjacent straight edge sub-areas 4121. At least one array of the first pad 421 can be disposed in the straight edge sub-area 4121, and at least one straight side of the first pad 421 disposed in the straight edge sub-area 4121 is parallel to the side 413 of the chip substrate. At least one array of the first pad 421 can be arranged in the corner edge sub-area 4122, and at least one straight side of the first pad 421 arranged in the corner edge sub-area 4122 can be at an angle of 45° with respect to the side 413 of the chip substrate. The straight side parallel to the side 413 of the chip substrate can share stress in the direction perpendicular to the side 413 of the chip substrate, and the straight side at a 45° angle with respect to the side 413 of the chip substrate can share stress on the corner edge sub-area 4122. In this way, the strength of the pad 42 when the chip 4 is impacted or bumped, and the bonding strength of the pad 42 and the tin ball can be improved.

Figure 11:
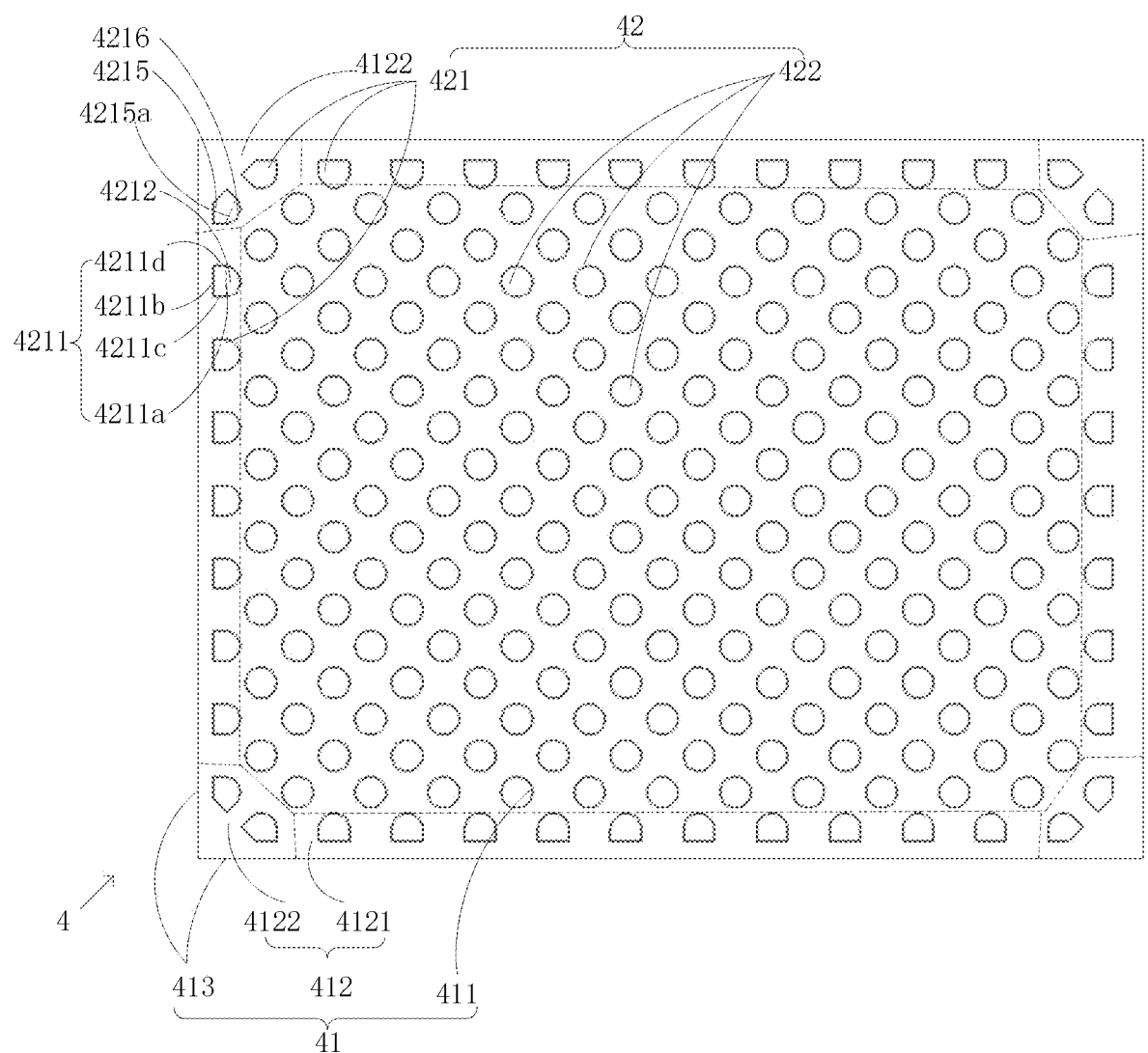
FIG. 11 is a schematic top view of a chip before soldering tin balls in an exemplary embodiment of the present disclosure.

In an embodiment, as shown in FIG. 11, the first pad 421 includes a rectangular soldering area 4211 and a semicircular soldering area 4212 connected to the rectangular soldering area 4211. A side 4211a of the rectangular soldering area 4211 is connected with the diameter side of the semicircular soldering area 4212 to form a soldering area shape of which half is a semicircle and half is a rectangle. The first pad 421 further includes a pentagonal soldering area 4215 and an arcuate soldering area 4216 connected to the pentagonal soldering area 4215. A side 4215a of the pentagonal soldering area 4215 is connected with a bowstring of the arcuate soldering area 4216. Two sides of the pentagonal soldering area 4215 are at 45° with respect to adjacent sides 413 of chip substrate respectively, and another two sides of the pentagonal soldering area 4215 may be parallel to the adjacent side 413 of the chip substrate, respectively.

In some embodiments, as shown in FIG. 11, the first pad 421 including the pentagonal soldering area 4215 may be distributed in the corner edge sub-area 4122 to buffer stress acting on the corner edge sub-area 4122 in various directions based on the angle of each side of the pentagonal soldering area 4215, which has a better stress sharing effect and facilitates to strengthen overall strength of the first pad 421. The above first pad 421 including the pentagonal pad 4215 may be arrayed in a row along a direction at 45° with respect to the adjacent side 413 of the chip substrate, and each row may have 2, 3 or more first pads 421. The first soldering area of which half is a semicircle and half is a rectangle may be distributed in the straight edge sub-area 4121, so as to buffer stress acting on the straight edge sub-area 4121 based on the straight side of the rectangular soldering area 4211.

Figure 12:
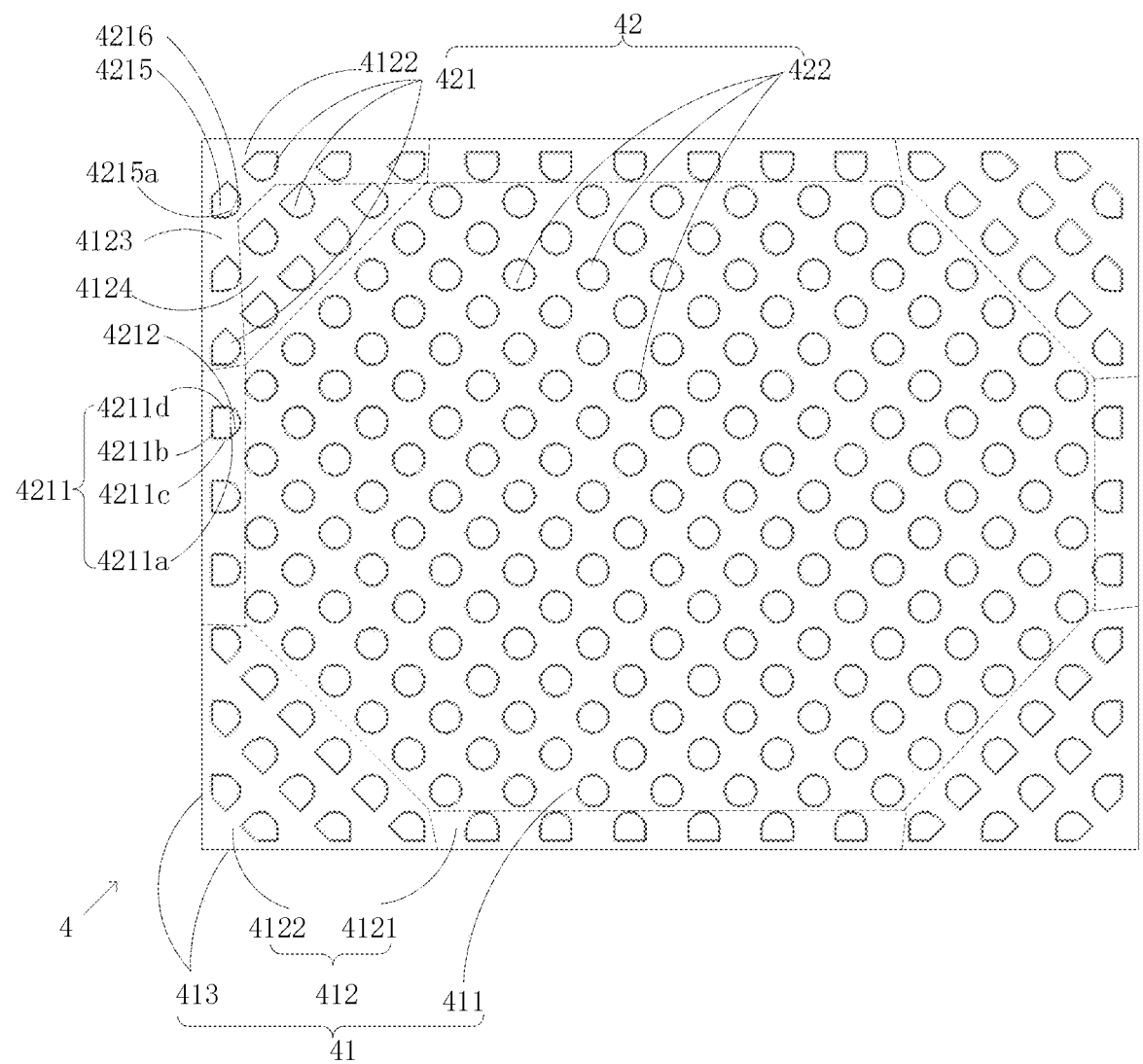
FIG. 12 is a schematic top view of a chip before soldering tin balls in an exemplary embodiment of the present disclosure.

In other embodiments, the edge area 412 may include a peripheral area 4123 close to a side 413 of the chip substrate, and a transition area 4124 connected to the peripheral area 4123 and the central area 411 respectively. For example, FIG. 12 shows a corner edge sub-area 4122 of the edge area 412, the corner edge sub-area 4122 includes the peripheral area 4123 close to the side 413 of the chip substrate, and the transition area 4124 connected to the peripheral area 4123 and the central area 411, respectively. The above first pad 421 including the pentagonal pad 4215 and the first pad 421 of which half is a semicircle and half is a rectangle may be distributed in the peripheral area 4123 and the transition area 4124 of the corner edge sub-area 4122, and the first pad 421 may be arrayed in two, three or more rows along a direction at 45° with respect to an adjacent side 413 of the chip substrate, and each row may include two, three or more first pads 421. As shown in FIG. 12, the first pads 421 are arrayed in three rows along a direction at 45° with respect to the adjacent side 413 of the chip substrate. The first pad 421 including the pentagonal pad 4215 can be arranged at two ends of each row, and the first pad 421 of which half is a semicircle and half is a rectangle may be arranged in the middle of each row to improve the buffering effect of the stress on the corner edge sub-areas through the arrangement of the straight side of the first pad 421. The first pad 421 of which half is a semicircle and half is a rectangle may be distributed in the straight edge sub-area 4121, so as to buffer stress acting on the straight edge sub-area 4121 based on the straight side of the rectangular soldering area 4211.

Figure 13:
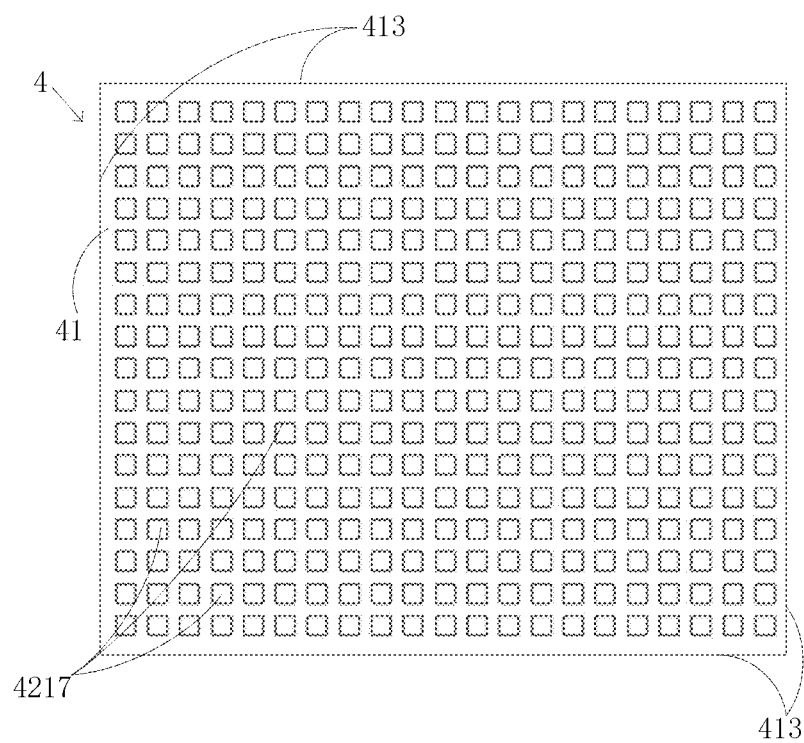
FIG. 13 is a schematic top view of a chip before soldering tin balls in an exemplary embodiment of the present disclosure.

In some embodiments, the first pad 421 includes a polygonal soldering area. As shown in FIG. 13, the first pad 421 includes a rectangular pad 4217, a straight side of the rectangular pad 4217 is parallel to a side 413 of the chip substrate of the chip 4 to share stress on the side 413 of the chip substrate of the chip. The stress may be perpendicular to the side 413 of the chip substrate, or may be at a preset angle with respect to the side 413 of the chip substrate.

The above rectangular pad 4217 may be arranged on a circumference of the edge area 412 of the chip substrate 41. That is, the edge area 412 adjacent to each side 413 of the chip substrate of the chip 4 is provided with one or more rows of rectangular pad 4217 to share stress from the corresponding side, and increase the strength of the system based on the periphery of the chip substrate 41. In addition, the structure of the first pad 421 in this embodiment is the same to facilitate processing and arrangement.

In the above embodiments, the second pad 422 may be a soldering area formed by arc lines, such as a circular soldering area, an elliptical soldering area, or the like. Alternatively, the second pad 422 may be an irregularly shaped soldering area surrounded by one or more arc lines. In this way, internal stress of the chip 4 can be buffered by one or more arc structures at the edge of the second pad 422. For example, the second pad 422 has a circular soldering area and the diameter of the circular soldering area is 0.23 mm, a plurality of second pads 422 may be arrayed in the central area 411 of the chip substrate 41. Alternatively, a plurality of second pads 422 may be irregularly distributed in the central area 411 of the chip substrate 41 according to the structure of the chip substrate 41 and arrangement of the electronic components.

In some embodiments, the second pad 422 may also be a polygonal soldering area. For example, the second pad 422 is a rectangular pad as shown in FIG. 13. Alternatively, the second pad 422 is a soldering area formed by a polygonal soldering area and a circular pad, or the second pad 422 is a soldering area formed by a polygonal soldering area and an arc line, which is not limited thereto.

In some embodiments, a distance between two adjacent pads 42 may be 0.35 mm, 0.4 mm, 0.5 mm, 0.8 mm, etc., where the distance between two adjacent pads 42 may refer to a distance between centers of two adjacent pads 42.

FIGS. 14-18 are schematic top views of a circuit board 5 before soldering tin balls in exemplary embodiments of the present disclosure. The circuit board 5 includes a circuit board substrate 51 and a plurality of pads 52 provided on the circuit board substrate 51. The plurality of pads 52 includes a first pad 521 and a second pad 522. The circuit board substrate 51 includes a central area 511 and an edge area 512 surrounding the central area 511. The first pad 521 is disposed in the edge area 512, and the second solder 522 is disposed in the central area 511. The first pad 521 includes at least one straight side adjacent to the side 513 of the circuit board substrate.

In the above embodiments, the straight side of the first pad 521 can share the stress from the peripheral edge of the circuit board substrate 51. Based on the above structural arrangement, the stress resistance of each pad 52 located in different areas of the circuit board substrate 51 can be enhanced, and the structural strength of the pad 52 can be increased. Each pad 52 can be soldered with a tin ball, so the above-mentioned structure arrangement can also facilitate to strengthen the bonding strength of the pad 52 and the tin ball, and prevent the pad 52 and the tin ball from being disconnected from each other due to the impacts, drops and the like during testing and using, and thereby improving life of the circuit board 5.

In some embodiments, at least one straight side is parallel to the side 513 of the circuit board substrate to improve the stress resistance of the first pad 521 based on the straight side parallel to the side 513 of the circuit board substrate. Further, the straight sides of the first pad 521 parallel to the side 513 of the circuit board substrate are collinear, and the above collinear straight sides share the stress from the side 513 of the circuit board substrate, which can improve the strength of the pad 52 when the circuit board 5 is impacted or bumped, and the like, and increase the bonding strength of the pad 52 and the tin ball.

In some embodiments, the areas of the first pad 521 and the second pad 522 are the same. By providing the first pad 521 and the second pad 522 with same area, same amount of the tin ball can be soldered on the pad 52, and thus interference and influence on the soldering process when improving the structure and shape of the first pad 521 and/or the second pad 522 can be avoided, thereby improving the soldering stability. For example, the above structure can reduce problems of soldering instability caused by missing soldering or uneven amount of tin.

Figure 14:
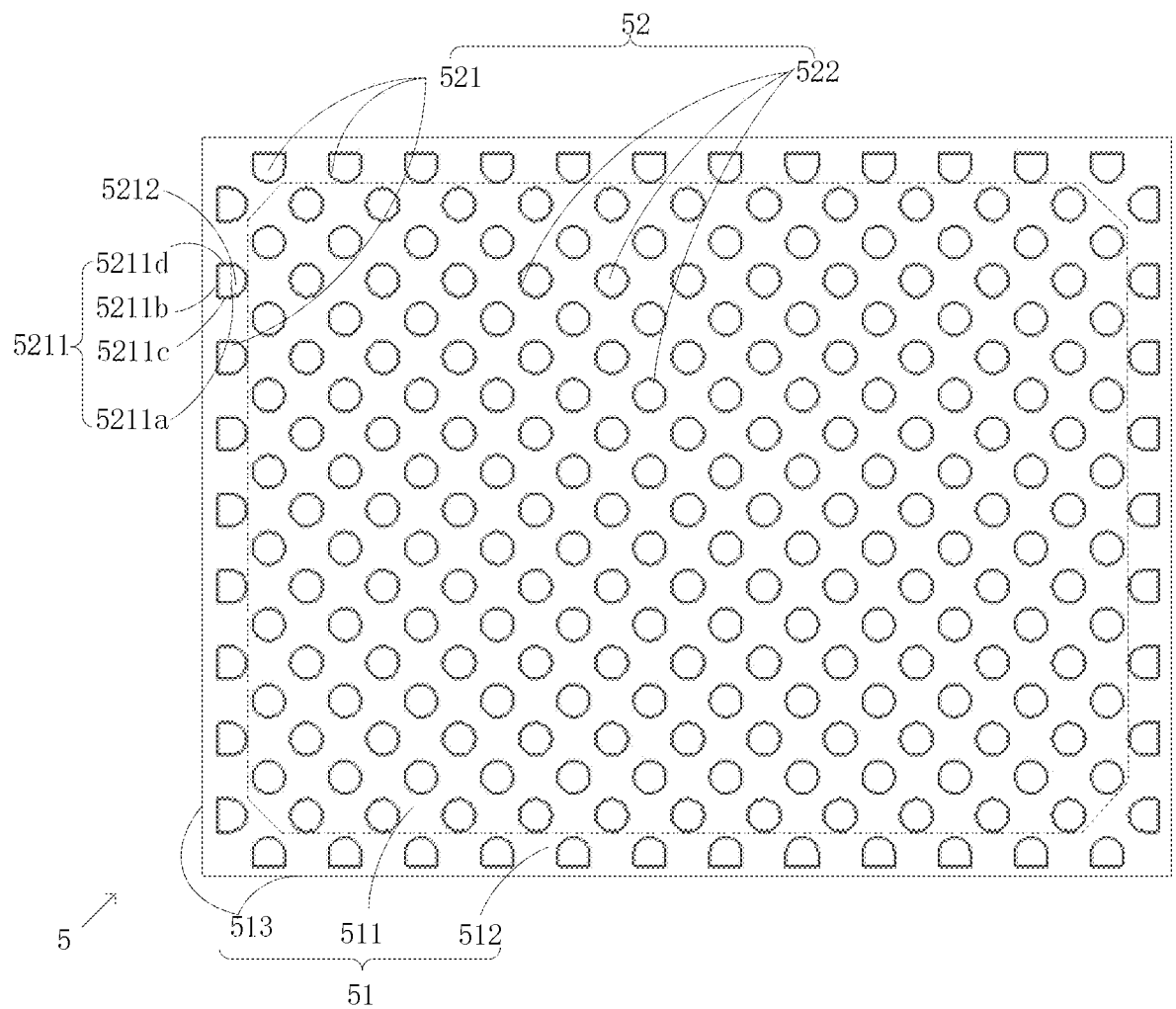
FIG. 14 is a schematic top view of a circuit board before soldering tin balls in an exemplary embodiment of the present disclosure.

In some embodiments, the first pad 521 includes a rectangular soldering area 5211 and an arcuate soldering area connected to the rectangular soldering area 5211. The arcuate soldering area may be a semicircular soldering area or have other arcuate shapes other than a semicircle, which is not limited thereto. In an embodiment, as shown in FIG. 14, the first pad 521 includes a rectangular soldering area 5211 and a semicircular soldering area 5212 connected to the rectangular soldering area 5211. A side 5211a of the rectangular soldering area 5211 is connected with the diameter side of the semicircular soldering area 5212 to form a soldering area shape of which half is a semicircle and half is a rectangle. The side 5211a of the rectangular soldering area 5211 and a four side 5211b which is opposite to the side 5211a are parallel to a side 513 of the circuit board substrate of the circuit board 5, and the side 5211b is adjacent to the side 513 of the circuit board substrate to share stress on the side 513 of the circuit board substrate; the stress may be perpendicular to the side 513 of circuit board substrate, or may be at a preset angle with respect to the side 513 of the circuit board substrate. The rectangular soldering area 5211 may further include a side 5211c and a side 5211d which are perpendicular to the side 5211a, where the side 5211c and the side 5211d are parallel to another side 513 of the circuit board substrate of the circuit board to share stress on the another side 513 of the circuit board substrate; the stress may be perpendicular to the another side 513 of the circuit board substrate, or may be at a preset angle to the another side 513 of the circuit board substrate.

The first pad 521 of which half is a semicircle and half is a rectangle may be arranged on a circumference of the edge area 512 of the circuit board substrate 51. That is, each edge area 512 adjacent to each side 513 of the circuit board substrate of the circuit board 5 is provided with one or more rows of the first pad 521 of which half is a semicircle and half is a rectangle to share stress from corresponding side, and the strength of the system can be improved based on this periphery of the circuit board substrate 51. In addition, the structure of the first pad 521 in this embodiment is provided to be the same to facilitate processing and arrangement.

Figure 15:
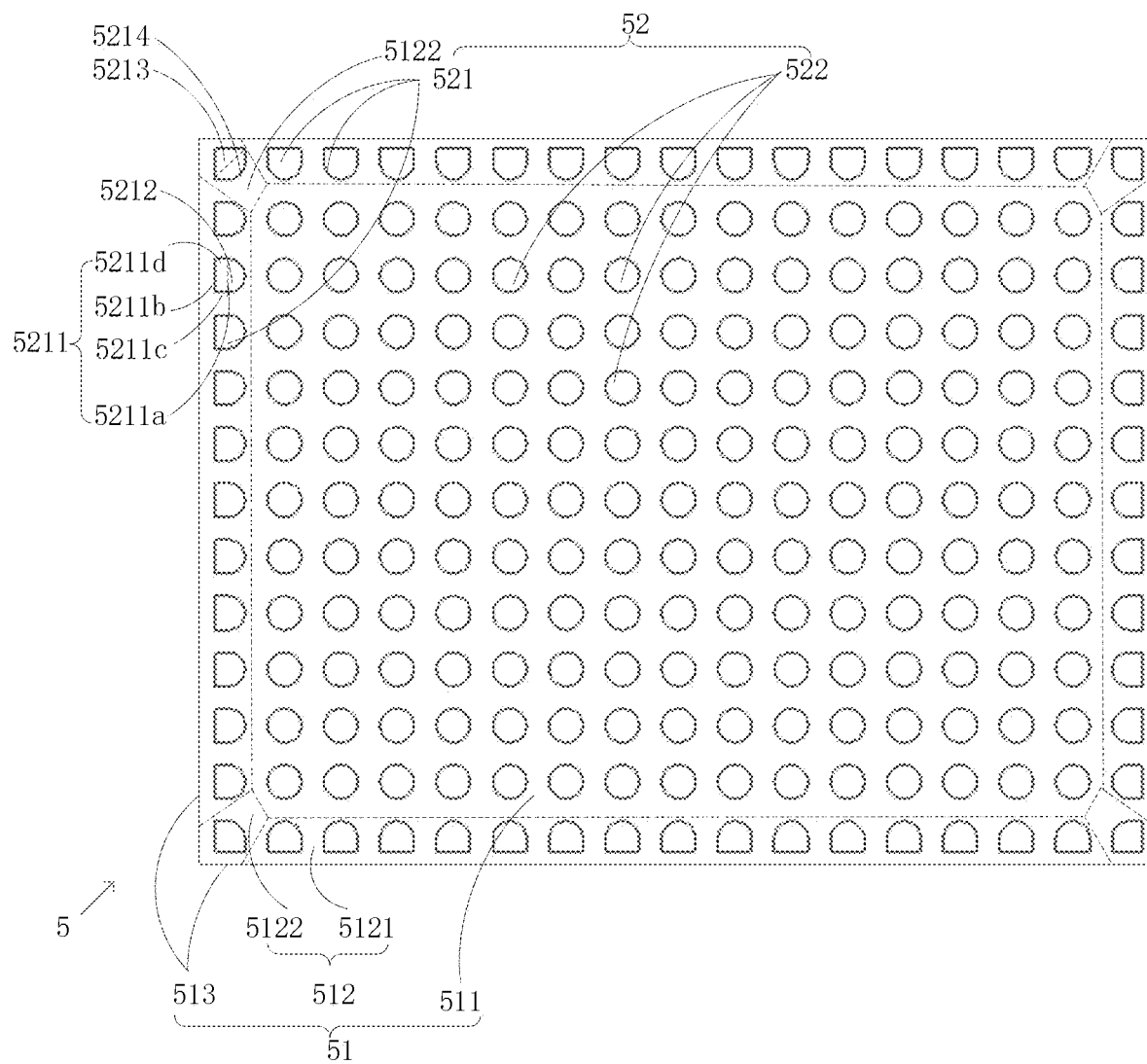
FIG. 15 is a schematic top view of a circuit board before soldering tin balls in an exemplary embodiment of the present disclosure.

In an embodiment, as shown in FIG. 15, the first pad 521 includes a rectangular soldering area 5211 and a semicircular soldering area 5212 connected to the rectangular soldering area 5211. A side 5211a of the rectangular soldering area 5211 is connected with the diameter side of the semicircular soldering area 5212 to form a soldering area shape of which half is a semicircle and half is a rectangle. The first pad 521 further includes a triangular soldering area 5213 and an arcuate soldering area 5214 connected to the triangular soldering area 5213. A side of the triangular soldering area 5213 is connected with a bowstring of the arcuate soldering area 5214 to form a sector-shaped soldering area. The edge area 512 includes a straight edge sub-area 5121 and a corner edge sub-area 5122 connecting two adjacent straight edge sub-areas 5121.

The first soldering area of which half is a semicircle and half is a rectangle can be arranged in the straight edge sub-area. The rectangular soldering area 5211 of the first soldering area of which half is a semicircle and half is a rectangle has a side 5211a and a side 5211b opposite to the side 5211a which are parallel to a side 513 of the circuit board substrate of the circuit board, and the side 5211b is adjacent to a side 513 of the circuit board substrate to share stress acting on the side 513 of the circuit board substrate, and the stress may be perpendicular to the side 513 of the circuit board substrate, or may be at a preset angle with respect to the side 513 of the circuit board substrate. The rectangular soldering area 5211 may further include a side 5211c and a side 5211d perpendicular to the side 5211a, where the side 5211c and the side 5211d are parallel to another side 513 of the circuit board substrate of the circuit board to share stress acting on the another side 513 of the circuit board substrate, and the stress may be perpendicular to the another side 513 of the circuit board substrate, or may be at a preset angle to the side 513 of the circuit board substrate.

The sector-shaped first soldering area is arranged in the corner edge sub-area 5122. The triangular soldering area 5213 may be a right triangle soldering area 5213. Two legs of the right triangle soldering area 5213 are respectively parallel to two adjacent sides 513 of the circuit board substrate to share the stress acting on the corner edge sub-area 5122, where the stress may be perpendicular to any one of the two adjacent sides 513 of the circuit board substrate, or may have a preset angle with any one of the two adjacent sides 513 of the circuit board substrate.

In some embodiments, the edge area 512 includes the straight edge sub-area 5121 and the corner edge sub-area 5122 connecting two adjacent straight edge sub-areas 5121. At least one array of the first pad 521 can be disposed in the straight edge sub-area 5121, and at least one straight side of the first pad 521 disposed in the straight edge sub-area 5121 is parallel to the side 513 of the circuit board substrate. At least one array of the first pad 521 can be arranged in the corner edge sub-area 5122, and at least one straight side of the first pad 521 arranged in the corner edge sub-area 5122 can be at an angle of 45° with respect to the side 513 of the circuit board substrate. The straight side parallel to the side 513 of the circuit board substrate can share stress in the direction perpendicular to the side 513 of the circuit board substrate, and the straight side at a 45° angle with respect to the side 513 of the circuit board substrate can share stress acting on the corner edge sub-area 5122. In this way, the strength of the pad 52 when the circuit board 5 is impacted or bumped, and the bonding strength of the pad 52 and the tin ball can be improved.

In an embodiment, the first pad 521 includes a rectangular soldering area 5211 and a semicircular soldering area 5212 connected to the rectangular soldering area 5211. A side 5211a of the rectangular soldering area 5211 is connected with the diameter side of the semicircular soldering area 5212 to form a soldering area shape of which half is a semicircle and half is a rectangle. The first pad 521 further includes a pentagonal soldering area 5215 and an arcuate soldering area 5216 connected to the pentagonal soldering area 5215. A side 5215a of the pentagonal soldering area 5215 is connected with a bowstring of the arcuate soldering area 5216. Two sides of the pentagonal soldering area 5215 are at 45° with respect to adjacent sides 513 of circuit board substrate respectively, and another two sides of the pentagonal soldering area 5215 may be parallel to the adjacent side 513 of the circuit board substrate, respectively.

Figure 16:
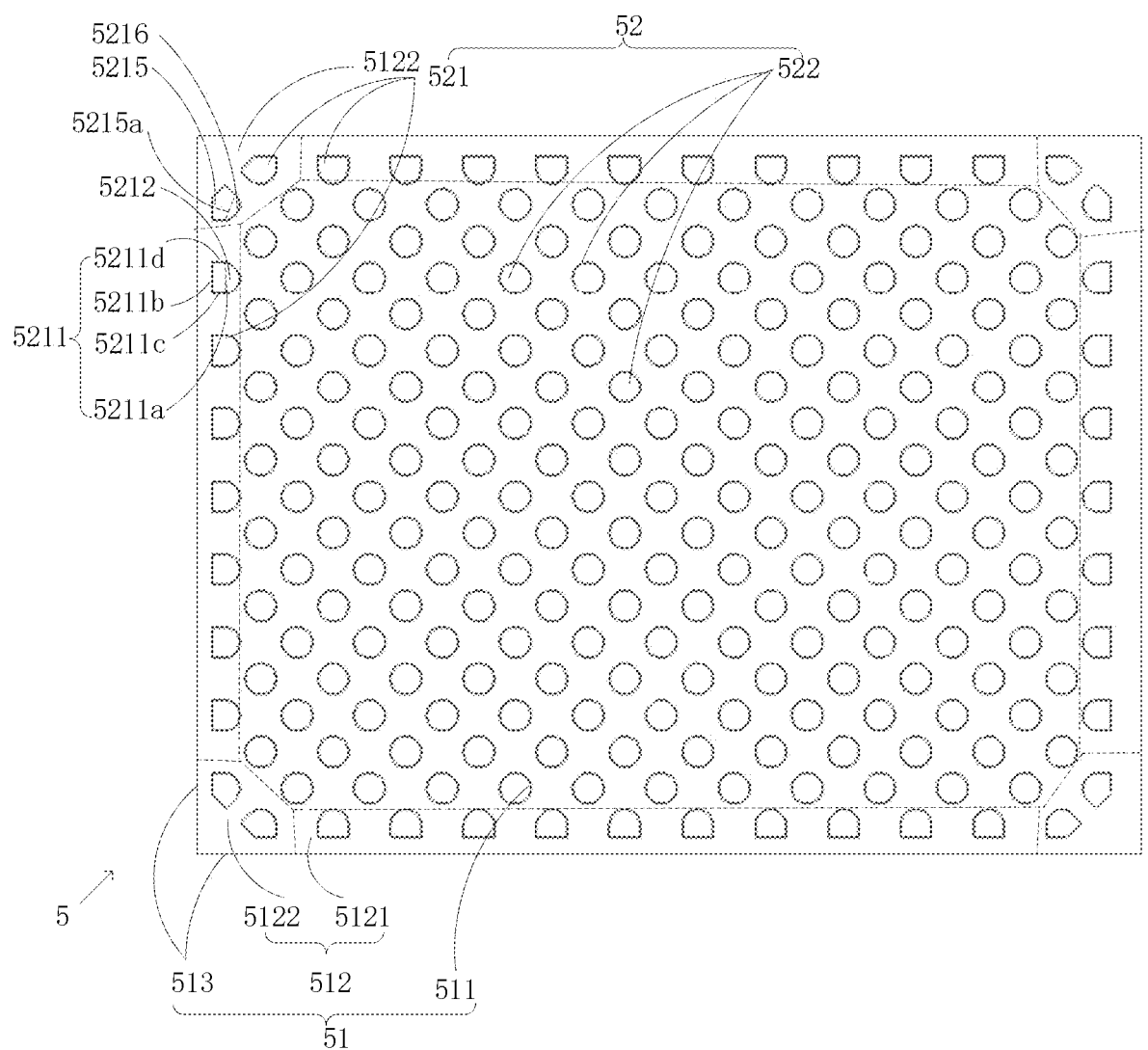
FIG. 16 is a schematic top view of a circuit board before soldering tin balls in an exemplary embodiment of the present disclosure.

In some embodiments, as shown in FIG. 16, the first pad 521 including the pentagonal soldering area 5215 may be distributed in the corner edge sub-area 5122 to buffer stress acting on the corner edge sub-area 5122 in various directions based on the angle of each side of the pentagonal soldering area 5215, which has a better stress sharing effect and facilitates to strengthen overall strength of the first pad 521. The above first pad 521 including the pentagonal pad 5215 may be arrayed in a row along a direction at 45° with respect to the adjacent side 513 of the circuit board substrate, and each row may have 2, 3 or more first pads 521. The first soldering area of which half is a semicircle and half is a rectangle may be distributed in the straight edge sub-area 5121, so as to buffer stress acting on the straight edge sub-area 5121 based on the straight side of the rectangular soldering area 5211.

Figure 17:
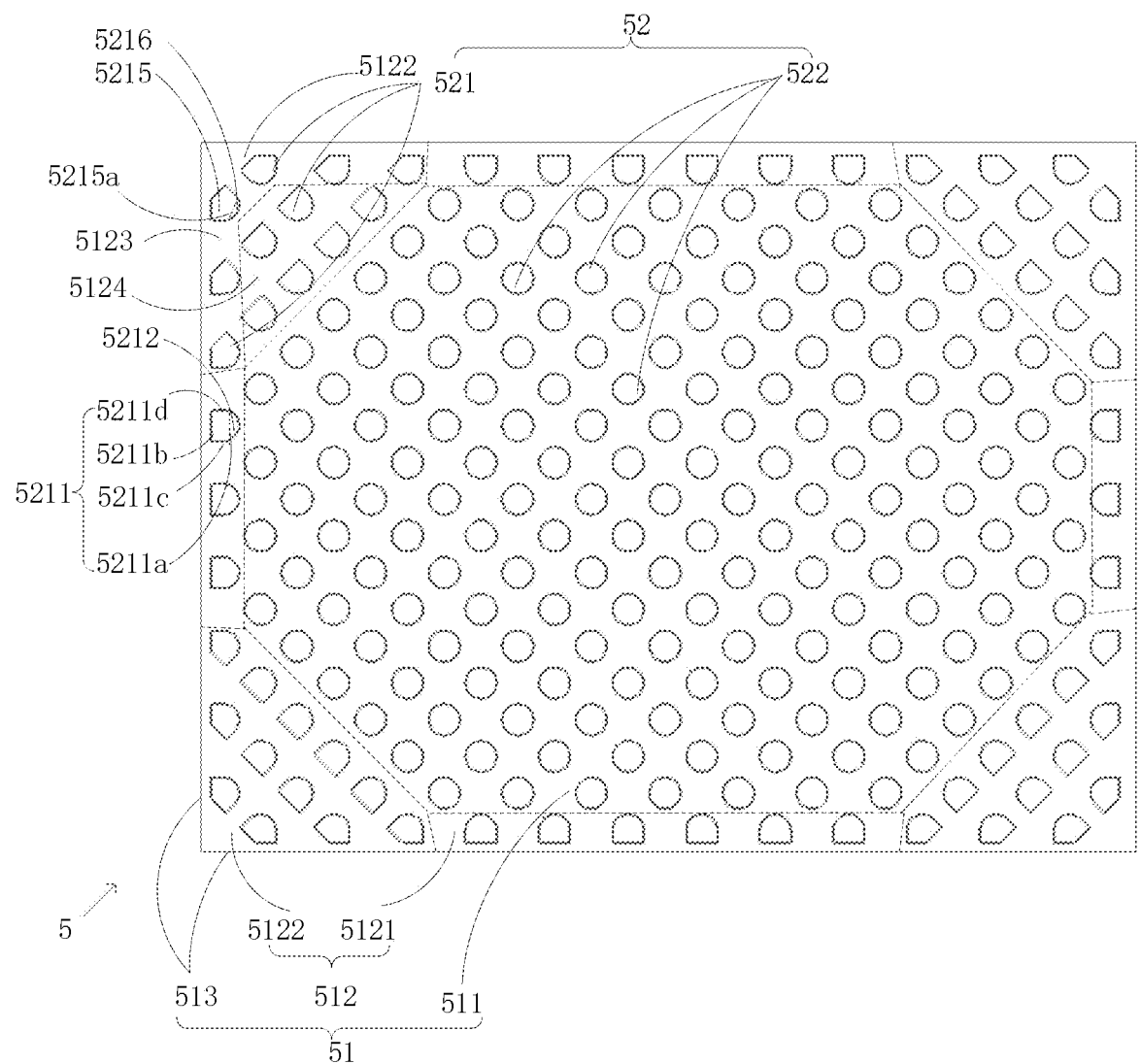
FIG. 17 is a schematic top view of a circuit board before soldering tin balls in an exemplary embodiment of the present disclosure.

In some embodiments, as shown in FIG. 17, the edge area 512 may include a peripheral area 5123 close to a side 513 of the circuit board substrate, and a transition area 5124 connected to the peripheral area 5123 and the central area 511 respectively. For example, FIG. 12 shows a corner edge sub-area 5122 of the edge area 512, the corner edge sub-area 5122 includes the peripheral area 5123 close to the side 513 of the circuit board substrate, and the transition area 5124 connected to the peripheral area 5123 and the central area 511, respectively. As shown in FIG. 17, the above first pad 521 including the pentagonal pad 5215 and the first pad 521 of which half is a semicircle and half is a rectangle may be distributed in the peripheral area 5123 and the transition area 5124 of the corner edge sub-area 5122, and the first pad 521 may be arrayed in two, three or more rows along a direction at 45° with respect to an adjacent side 513 of the circuit board substrate, and each row may include two, three or more first pads 521. The first pad 521 including the pentagonal pad 5215 can be arranged at two ends of each row, and the first pad 521 of which half is a semicircle and half is a rectangle may be arranged in the middle of each row to improve the buffering effect of the stress on the corner edge sub-areas through the arrangement of the straight side of the first pad 521. The first pad 521 of which half is a semicircle and half is a rectangle may be distributed in the straight edge sub-area 5121, so as to buffer stress acting on the straight edge sub-area 5121 based on the straight side of the rectangular soldering area 5211.

Figure 18:
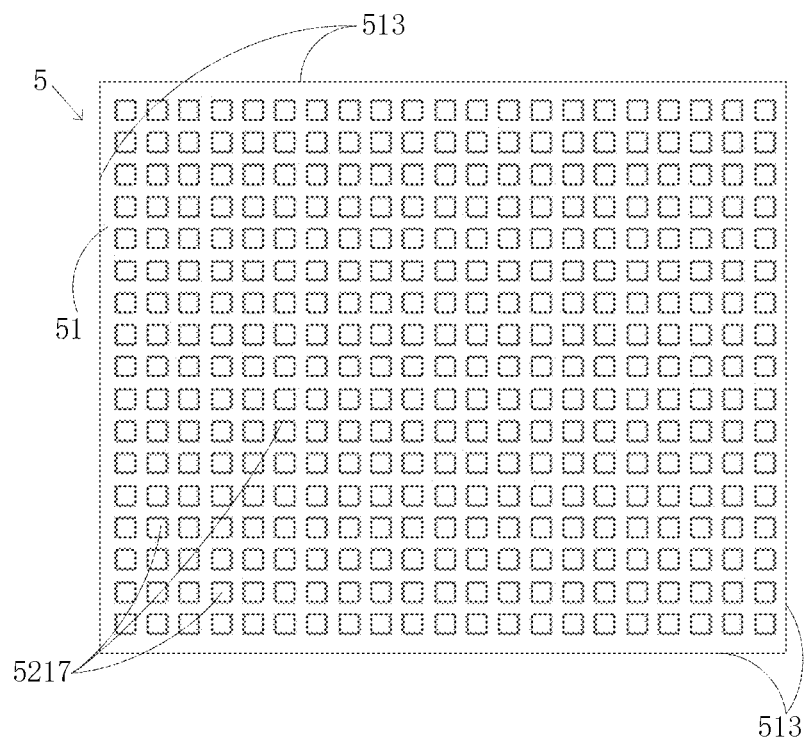
FIG. 18 is a schematic top view of a circuit board before soldering tin balls in an exemplary embodiment of the present disclosure.

In some other embodiments, the first pad 521 includes a polygonal soldering area. As shown in FIG. 18, the first pad 521 includes a rectangular pad 5217, a straight side of the rectangular pad 5217 is parallel to a side 513 of the circuit board substrate of the circuit board 5 to share stress on the side 513 of the circuit board substrate of the circuit board. The stress may be perpendicular to the side 513 of the circuit board substrate, or may be at a preset angle with respect to the side 513 of the circuit board substrate.

The above rectangular pad 5217 may be arranged on a circumference of the edge area 512 of the circuit board substrate 51. That is, the edge area 512 adjacent to each side 513 of the circuit board substrate of the circuit board 5 is provided with one or more rows of rectangular soldering area 5217 to share stress from the corresponding side, and increase the strength of the system based on the periphery of the circuit board substrate 51. In addition, the structure of the first pad 521 in this embodiment is the same to facilitate processing and arrangement.

In the above embodiments, the second pad 522 may be a soldering area formed by arc lines, such as a circular soldering area, an elliptical soldering area, or the like. Alternatively, the second pad 522 may be an irregularly shaped soldering area surrounded by one or more arc lines. In this way, internal stress of the circuit board 5 can be buffered by one or more arc structures at the edge of the second pad 522. For example, the second pad 522 has a circular soldering area and the diameter of the circular soldering area is 0.23 mm, a plurality of second pads 522 may be arrayed in the central area 511 of the circuit board substrate 51. Alternatively, a plurality of second pads 522 may be irregularly distributed in the central area 511 of the circuit board substrate 51 according to the structure of the circuit board substrate 51 and arrangement of the electronic components.

In other embodiments, the second pad 522 may also be a polygonal soldering area. For example, the second pad 522 is a rectangular pad as shown in FIG. 18. Alternatively, the second pad 522 is a soldering area formed by a polygonal soldering area and a circular pad, or the second pad 522 is a soldering area formed by a polygonal soldering area and an arc line, which is not limited thereto.

In some embodiments, a distance between two adjacent pads 52 may be 0.35 mm, 0.4 mm, 0.5 mm, 0.8 mm, etc., where the distance between two adjacent pads 52 may refer to a distance between centers of two adjacent pads 52.

Figure 19:
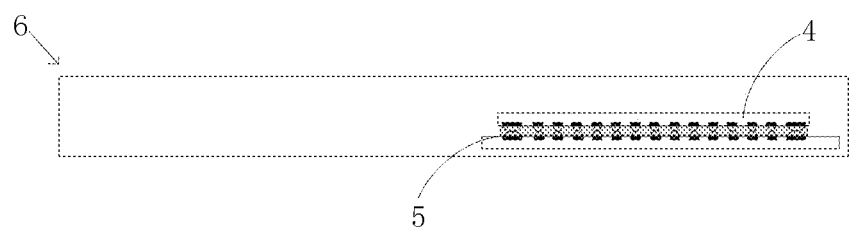
FIG. 19 is a schematic cross-sectional diagram of an electronic device in an exemplary embodiment of the present disclosure.

FIG. 19 is a schematic cross-sectional diagram of an electronic device 6 in an exemplary embodiment of the present disclosure. As shown in FIG. 19, the electronic device 6 may include: the chip 4 and the circuit board 5 described above, and the chip 4 is assembled on the circuit board 5. The circuit board 5 is provided with the first pad 521 and the second pad 522 described above. The first pad 521 of the circuit board 5 can be electrically connected to the first pad 421 of the chip 4 in a one-to-one correspondence, and the second pad 522 of the circuit board 5 can be electrically connected to the second pad 422 of the chip 4 in a one-to-one correspondence.

The chip substrate 41 of the chip 4 is divided into a central area 411 and an edge area 412, and the plurality of pads 42 are divided into a first pad 421 arranged in the edge area 412 of the substrate of the chip 4 and a second pad 422 arranged in the central area 411 of the substrate of the chip 4, and thus the straight side of the first pad 421 can share the stress from the peripheral edge of the chip substrate 41. Similarly, the circuit board substrate 51 of the circuit board 5 can also be divided into a central area 511 and an edge area 512, and the plurality of pads 52 are divided into a first pad 521 arranged in the edge area 512 of the circuit board substrate 51 and a second pad 522 in the central area 511 of the circuit board substrate 51, and thus the straight side of the first pad 521 can share the stress from the peripheral edge of the circuit board substrate 51. Based on the above structural arrangement, the stress resistance of each pad 42 and each pad 52 located in different areas of the substrates of the chip 4 and the circuit board 5 can be enhanced, the structural strength of the pads 42, 52 and the bonding strength of the pads 42, 52 and the tin balls can be increased, and the pad and the tin ball from being disconnected from each other due to the impacts, drops and the like during testing and using, and thereby improving life of the chip 4, circuit board 5 and electronic devices. In addition, based on the above-mentioned increasing in the strength of the pad and bonding strength between and the pad of the chip 4 and circuit board 5 and the tin ball, it is helpful to reduce the size of the pad and the distance between adjacent pads on the chip 4 and circuit board 5, thereby reducing size of the chip 4 and improving the lightness and thinness of electronic device 6.

The electronic device 6 may be a mobile phone, a tablet computer, a vehicle-mounted terminal or a medical terminal, etc., which is not limited in the present disclosure.

Those skilled in the art will easily think of other embodiments of the present disclosure after considering the specification and practicing the technical solutions disclosed herein. The present disclosure is intended to cover any variations, uses, or adaptive changes of the present disclosure. These variations, uses, or adaptive changes follow the general principles of the present disclosure and include common knowledge or conventional technical means in the technical field which are not disclosed in the present disclosure. The description and the embodiments are only regarded as exemplary, and the true scope and spirit of the present disclosure are pointed out by the following claims.

It should be understood that the present disclosure is not limited to the precise structure that has been described above and shown in the drawings, and various modifications and changes can be made without departing from its scope. The scope of the present disclosure is defined only by the appended claims.

What is claimed is:

1. A chip, comprising:
   a chip substrate comprising a central area and an edge area surrounding the central area; and
   a plurality of pads arranged on the chip substrate, the plurality of pads comprising a first pad and a second pad,
   wherein the first pad is arranged in the edge area and comprises at least one straight side adjacent to a side of the chip substrate, and
   the second pad is arranged in the central area;
   wherein the edge area comprises: a straight edge sub-area; and a corner edge sub-area connecting two adjacent straight edge sub-areas,
   wherein the first pad in the straight edge sub-area comprises a rectangular soldering area and an arcuate soldering area connected to the rectangular soldering area, and the rectangular soldering area is arranged between the arcuate soldering area and the side of the chip substrate,
   wherein the first pad in the corner edge sub-area comprises one of:
   a pentagonal soldering area and an arcuate soldering area connected to the pentagonal soldering area; or
   a triangular soldering area and an arcuate soldering area connected to the triangular soldering area.

2. The chip of claim 1, wherein the at least one straight side is parallel to the side of the chip substrate.

3. The chip of claim 2, wherein the at least one straight side parallel to a same side of the chip substrate is collinear.

4. The chip of claim 1, wherein the first pad and the second pad have same area.

5. The chip of claim 1,
   wherein a plurality of first pads are arrayed in the corner edge sub-area, and a straight side of at least one of the first pads arrayed in the corner edge sub-area is at 45° with respect to the side of the chip substrate.

6. The chip of claim 1, wherein the edge area comprises a peripheral area close to the side of the chip substrate, and a transition area connected to the peripheral area and the central area respectively.

7. The chip of claim 1, wherein the second pad comprises one of a circular soldering area or a polygonal soldering area.

8. A circuit board, comprising:
a circuit board substrate comprising a central area and an edge area surrounding the central area; and
a plurality of pads arranged on the circuit board substrate, the plurality of pads comprising a first pad and a second pad,
wherein the first pad is arranged in the edge area and comprises at least one straight side adjacent to a side of the circuit board substrate, and
the second pad is arranged in the central area;
wherein the edge area comprises: a straight edge sub-area, and a corner edge sub-area connecting two adjacent straight edge sub-areas,
wherein the first pad in the straight edge sub-area comprises a rectangular soldering area and an arcuate soldering area connected to the rectangular soldering area, and the rectangular soldering area is arranged between the arcuate soldering area and the side of the chip substrate,
wherein the first pad in the corner edge sub-area comprises one of:
a pentagonal soldering area and an arcuate soldering area connected to the pentagonal soldering area; or
a triangular soldering area and an arcuate soldering area connected to the triangular soldering area.

9. The circuit board of claim 8, wherein the at least one straight side is parallel to the side of the circuit board substrate.

10. The circuit board of claim 9, wherein the at least one the straight side parallel to a same side of the circuit board substrate is collinear.

11. The circuit board of claim 8, wherein the first pad and the second pad have same area.

12. The circuit board of claim 8,
wherein a plurality of first pads are arrayed in the corner edge sub-area, and a straight side of at least one of the plurality of first pads arrayed in the corner edge sub-area is at 45° with respect to the side of the circuit board substrate.

13. The circuit board of claim 8, wherein the edge area comprises a peripheral area close to the side of the circuit board substrate, and a transition area connected to the peripheral area and the central area respectively.

14. The circuit board of claim 8, wherein the second pad comprises one of a circular soldering area or a polygonal soldering area.

15. An electronic device, comprising:
a chip; and
a circuit board,
wherein the chip comprises:
a chip substrate comprising a central area and an edge area surrounding the central area; and
a first plurality of pads arranged on the chip substrate, the first plurality of pads comprising a first pad and a second pad, wherein the first pad is arranged in the edge area and comprises at least one straight side adjacent to a side of the chip substrate, and the second pad is arranged in the central area; and
wherein the circuit board comprises:
a circuit board substrate comprising a central area and an edge area surrounding the central area; and
a second plurality of pads arranged on the circuit board substrate, the second plurality of pads comprising a third pad and a fourth pad, wherein the third pad is arranged in the edge area and comprises at least one straight side adjacent to a side of the circuit board substrate, and the fourth pad is arranged in the central area,
wherein the edge area of the chip comprises: a straight edge sub-area; and a corner edge sub-area connecting two adjacent straight edge sub-areas,
wherein the first pad in the straight edge sub-area comprises a rectangular soldering area and an arcuate soldering area connected to the rectangular soldering area, and the rectangular soldering area is arranged between the arcuate soldering area and the side of the chip substrate,
wherein the first pad in the corner edge sub-area comprises one of:
a pentagonal soldering area and an arcuate soldering area connected to the pentagonal soldering area; or
a triangular soldering area and an arcuate soldering area connected to the triangular soldering area, and
wherein the edge area of the circuit board comprises: a straight edge sub-area, and a corner edge sub-area connecting two adjacent straight edge sub-areas,
wherein the third pad in the straight edge sub-area comprises a rectangular soldering area and an arcuate soldering area connected to the rectangular soldering area, and the rectangular soldering area is arranged between the arcuate soldering area and the side of the chip substrate,
wherein the third pad in the corner edge sub-area comprises one of:
a pentagonal soldering area and an arcuate soldering area connected to the pentagonal soldering area; or
a triangular soldering area and an arcuate soldering area connected to the triangular soldering area.

16. The electronic device of claim 15, wherein the at least one straight side of the third pad is parallel to the side of the circuit board substrate, and
the at least one the straight side of the third pad parallel to a same side of the circuit board substrate is collinear.

17. The electronic device of claim 15, wherein the third pad and the fourth pad have same area.

18. The electronic device of claim 15,
wherein a plurality of third pads are arrayed in the corner edge sub-area, and a straight side of at least one of the plurality of third pads arrayed in the corner edge sub-area is at 45° with respect to the side of the circuit board substrate.

* * * * *